(12) United States Patent
Lutz et al.

(10) Patent No.: US 7,074,637 B2
(45) Date of Patent: Jul. 11, 2006

(54) ANTI-STICTION TECHNIQUE FOR THIN FILM AND WAFER-BONDED ENCAPSULATED MICROELECTROMECHANICAL SYSTEMS

(75) Inventors: Markus Lutz, Palo Alto, CA (US); Aaron Partridge, Palo Alto, CA (US)

(73) Assignee: Robert Bosch GmbH, Struttgart (DE)

( * ) Notice: Subject to any disclaimer, the term of this patent is extended or adjusted under 35 U.S.C. 154(b) by 0 days.

(21) Appl. No.: 11/172,119

(22) Filed: Jun. 30, 2005

(65) Prior Publication Data

US 2005/0260783 A1     Nov. 24, 2005

Related U.S. Application Data

(62) Division of application No. 10/698,258, filed on Oct. 31, 2003, now Pat. No. 6,930,367.

(51) Int. Cl.
  *H01L 21/00* (2006.01)
(52) U.S. Cl. ............ 438/50; 438/52; 438/706; 216/2; 216/79
(58) Field of Classification Search ............... None
  See application file for complete search history.

(56) References Cited

U.S. PATENT DOCUMENTS

| | | | |
|---|---|---|---|
| 4,849,071 A | 7/1989 | Evans et al. | |
| 4,945,769 A | 8/1990 | Sidner et al. | |
| 5,445,991 A | 8/1995 | Lee | |
| 5,470,797 A | 11/1995 | Mastrangelo | |
| 5,616,514 A | 4/1997 | Muchow et al. | |
| 5,683,591 A | 11/1997 | Offenberg | |
| 5,804,083 A | 9/1998 | Ishii et al. | |
| 5,922,212 A | 7/1999 | Kano et al. | |
| 6,318,175 B1 | 11/2001 | Muchow et al. | |
| 6,423,563 B1 | 7/2002 | Fukada et al. | |
| 6,477,901 B1 | 11/2002 | Tadigadapa et al. | |
| 6,492,309 B1 | 12/2002 | Behr et al. | |
| 6,500,348 B1 | 12/2002 | Chase et al. | |
| 6,521,508 B1 | 2/2003 | Cheong et al. | |
| 6,590,267 B1 | 7/2003 | Goodwin-Johansson et al. | |

(Continued)

OTHER PUBLICATIONS

"Chemical Vapor Deposition of Fluoroalkylsilane Monolayer Films for Adhesion Control in Microelectromechanical Systems", Mayer et al., J. Vac. Sci. Technol. B 18(5), Sep./Oct. 2000. pp. 2433-2440.

*Primary Examiner*—Dung A. Le
(74) *Attorney, Agent, or Firm*—Neil A. Steinberg

(57) ABSTRACT

There are many inventions described and illustrated herein. In one aspect, there is described a thin film or wafer encapsulated MEMS, and technique of fabricating or manufacturing a thin film or wafer encapsulated MEMS employing anti-stiction techniques. In one embodiment, after encapsulation of the MEMS, an anti-stiction channel is formed in the encapsulation layer or substrate, thereby providing "access" to the chamber containing some or all of the active members or electrodes of the mechanical structures. Thereafter, an anti-stiction fluid (for example, gas or gas-vapor) is introduced into the chamber via the anti-stiction channel. The anti-stiction fluid may deposit on one, some or all of the active members of the mechanical structures thereby providing an anti-stiction layer (for example, a monolayer coating or self-assembled monolayer) and/or out-gassing molecules on such members or electrodes. After introduction and/or application of the anti-stiction fluid, the anti-stiction channel may be sealed, capped, plugged and/or closed.

35 Claims, 44 Drawing Sheets

U.S. PATENT DOCUMENTS

| | | |
|---|---|---|
| 6,602,351 B1 | 8/2003 | DeYoung et al. |
| 6,621,392 B1 | 9/2003 | Volant et al. |
| 6,625,047 B1 | 9/2003 | Coleman, Jr. |
| 6,625,342 B1 | 9/2003 | Staple et al. |
| 6,716,275 B1 | 4/2004 | Reed et al. |
| 6,739,497 B1 | 5/2004 | Fortin et al. |
| 6,764,875 B1 | 7/2004 | Shook |
| 6,815,361 B1 * | 11/2004 | Bae et al. .................. 438/706 |
| 6,818,464 B1 | 11/2004 | Heschel |
| 6,822,326 B1 | 11/2004 | Enquist et al. |
| 6,835,657 B1 | 12/2004 | Ong |
| 6,847,124 B1 | 1/2005 | Semi |
| 6,858,910 B1 | 2/2005 | Coyle et al. |
| 2002/0132062 A1 | 9/2002 | Jacobs |
| 2002/0179126 A1 | 12/2002 | DeYoung et al. |
| 2002/0197002 A1 | 12/2002 | Lin |
| 2003/0002019 A1 | 1/2003 | Miller |
| 2003/0016337 A1 | 1/2003 | Duncan et al. |
| 2003/0038327 A1 | 2/2003 | Smith |
| 2003/0054588 A1 | 3/2003 | Patel et al. |
| 2003/0146464 A1 | 8/2003 | Prophet |
| 2003/0155643 A1 | 8/2003 | Freidhoff |
| 2003/0161949 A1 | 8/2003 | Ashurst et al. |
| 2003/0178635 A1 | 9/2003 | Volant et al. |
| 2003/0183916 A1 | 10/2003 | Hack et al. |

* cited by examiner

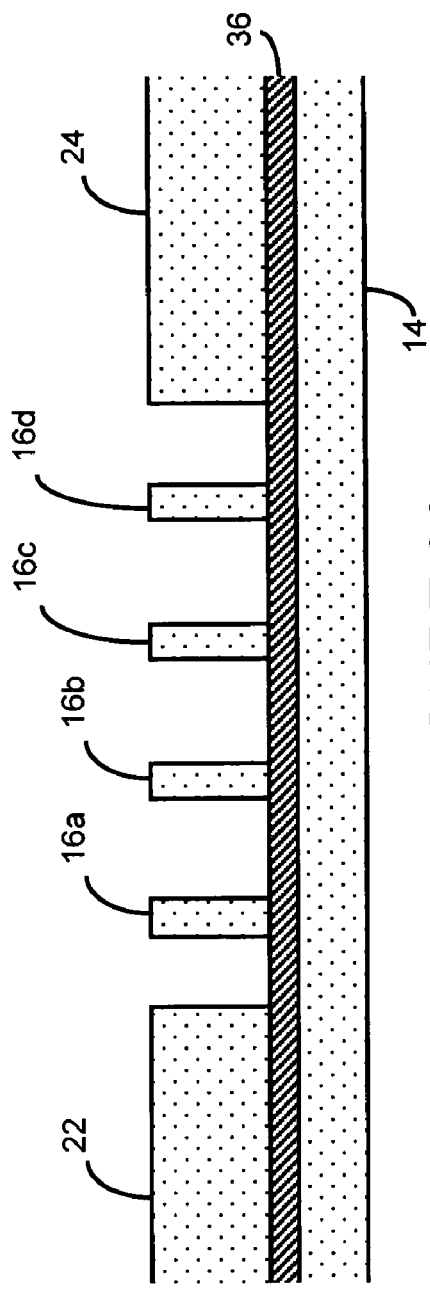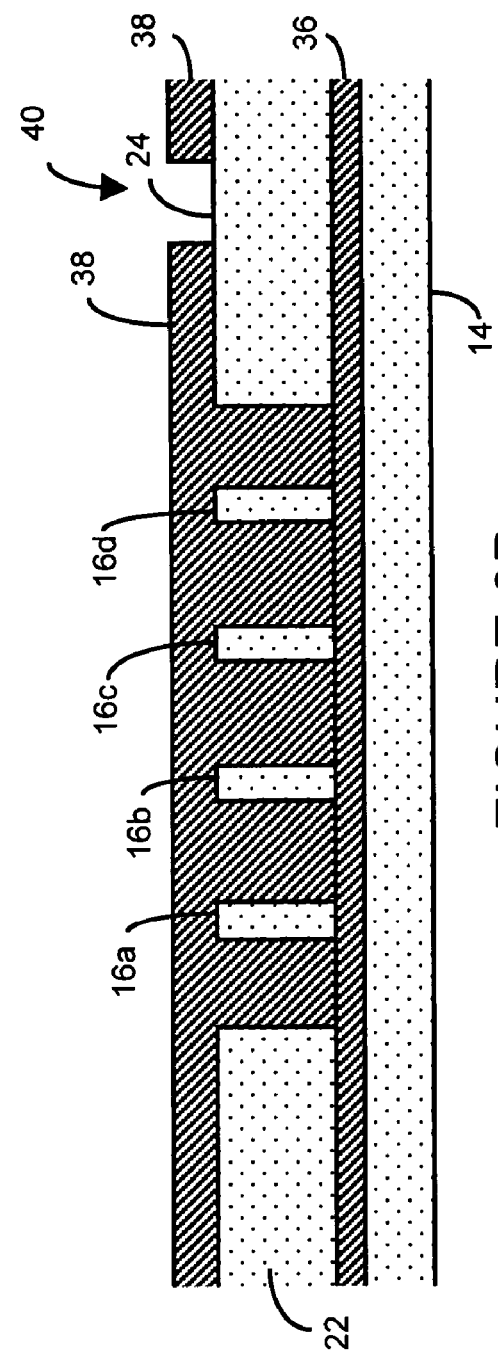

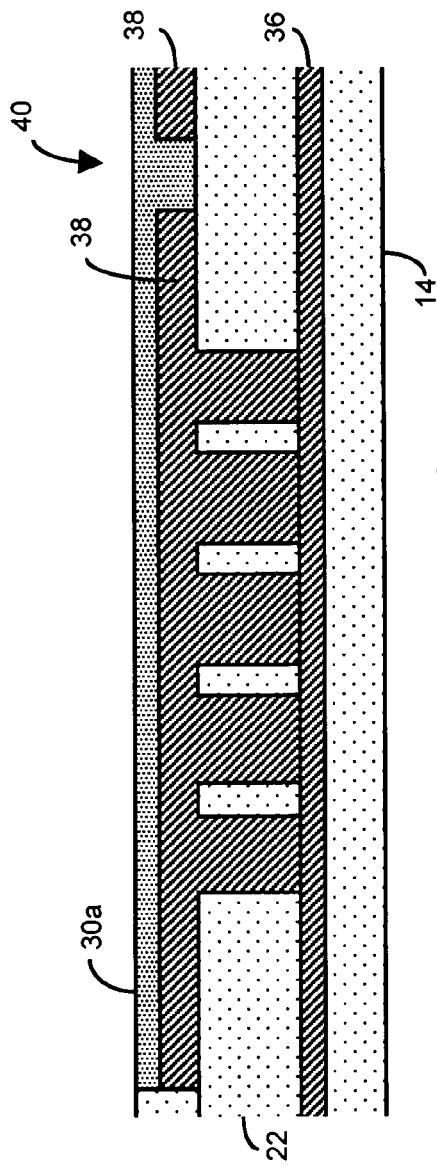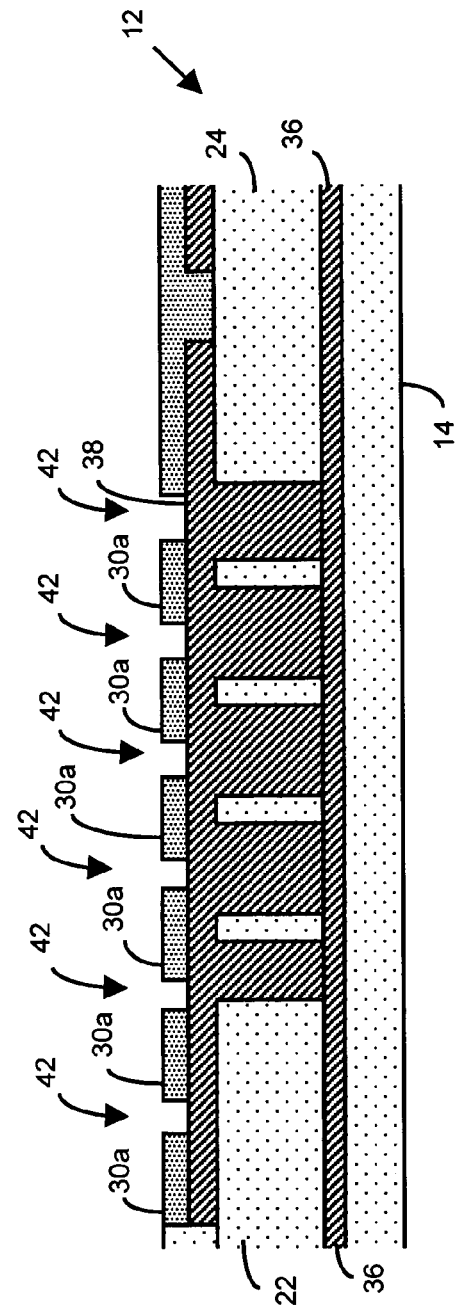

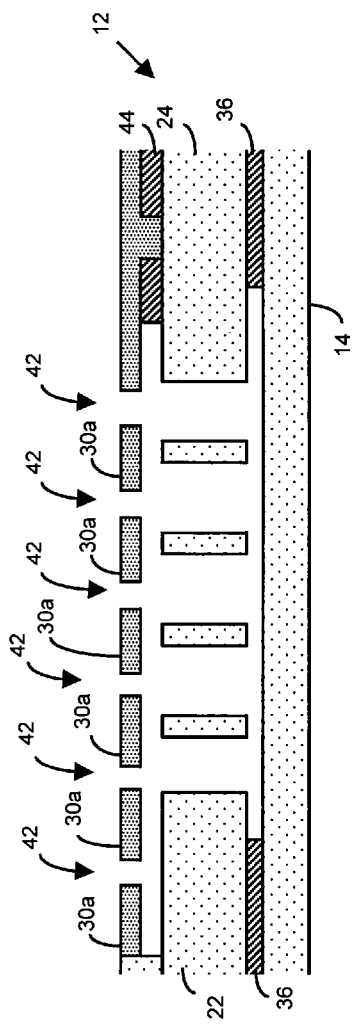
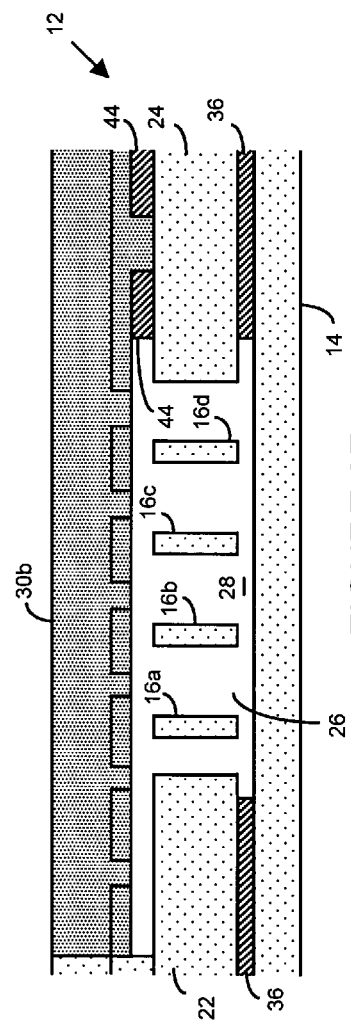

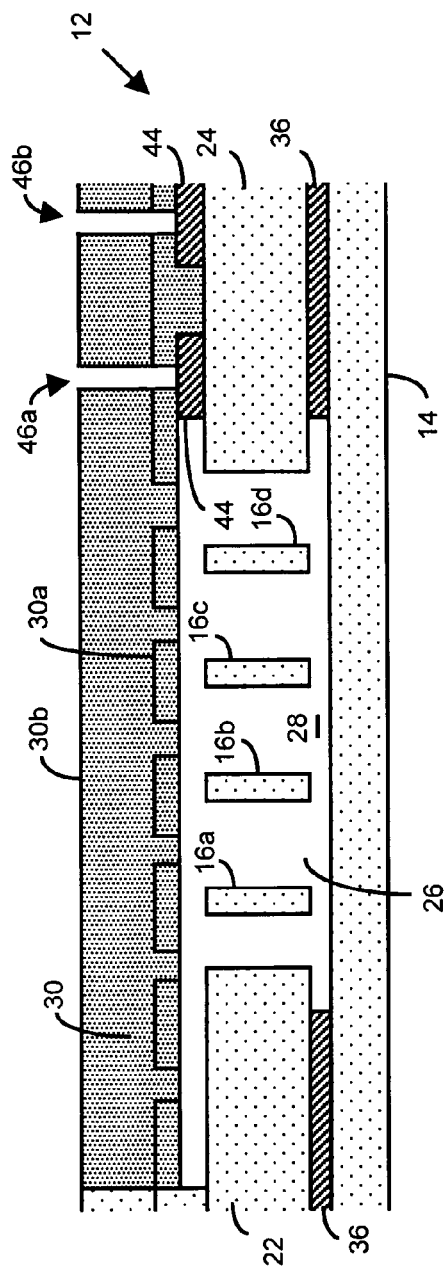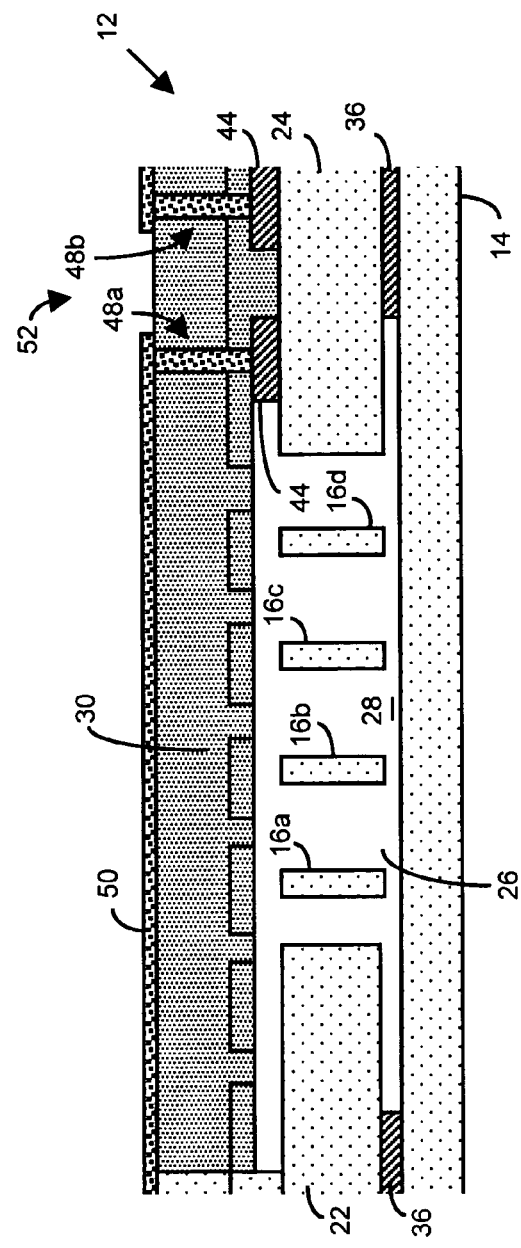

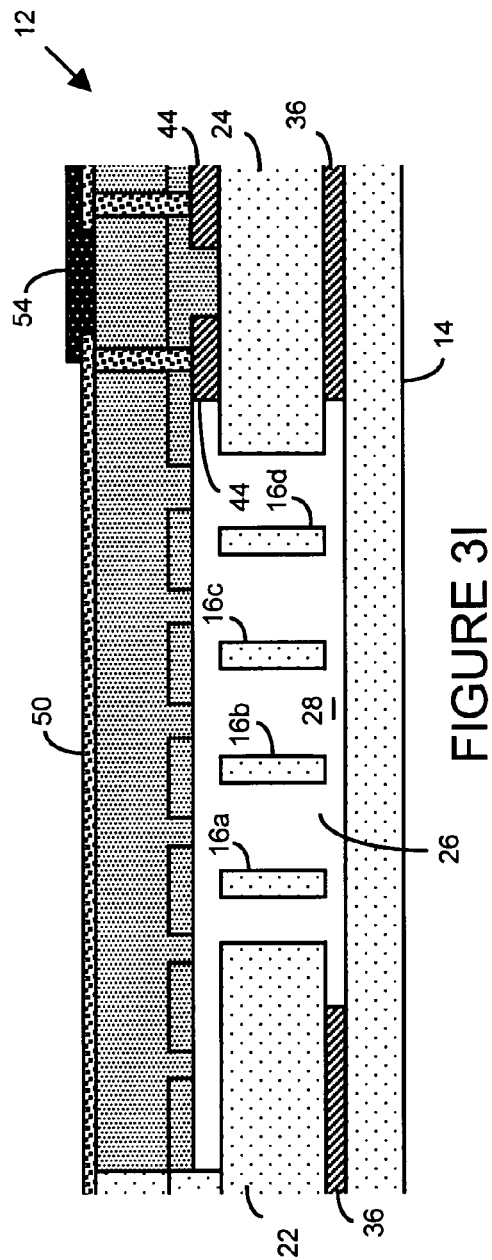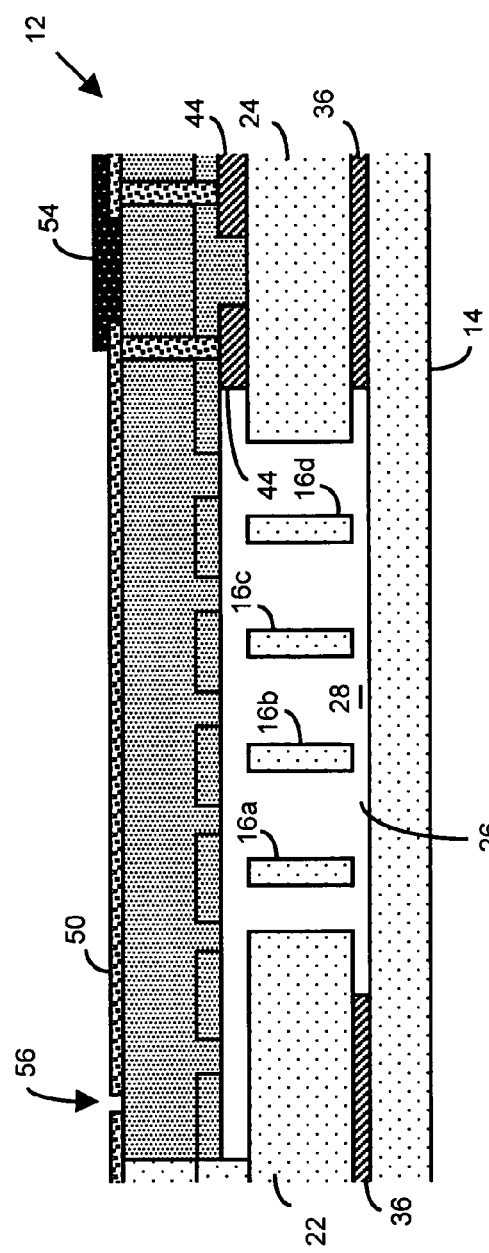

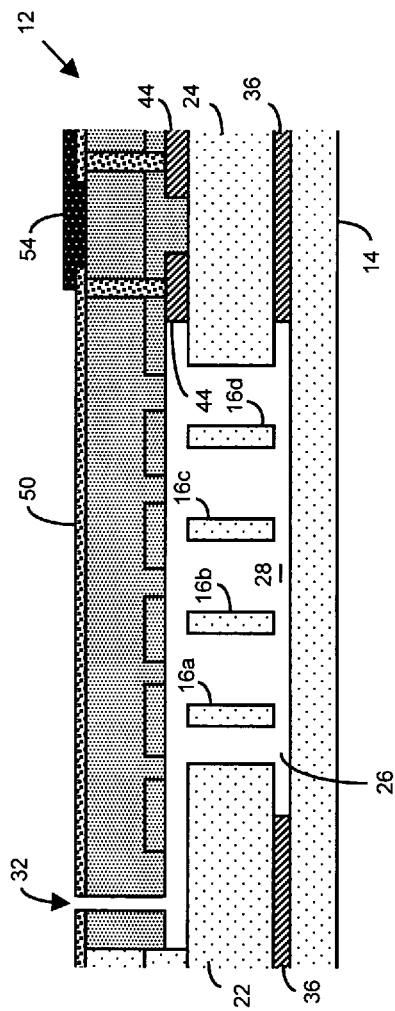
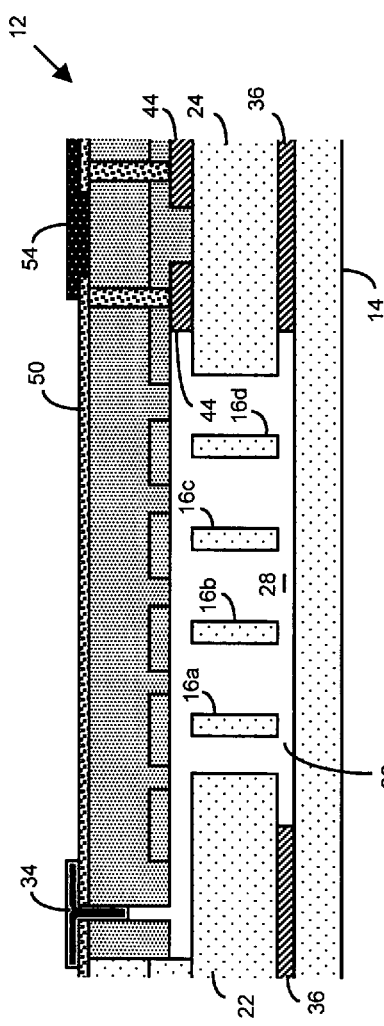
FIGURE 3K
FIGURE 3L

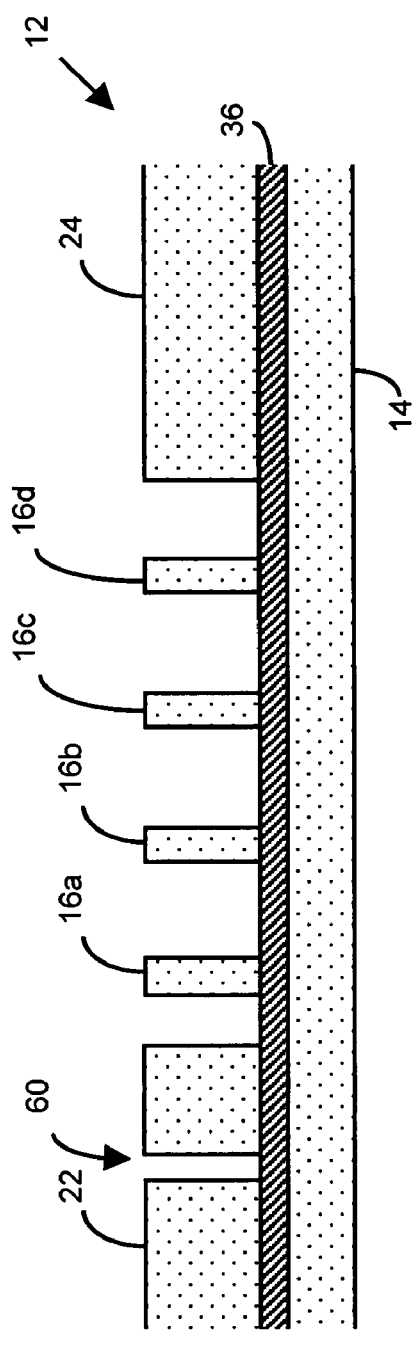
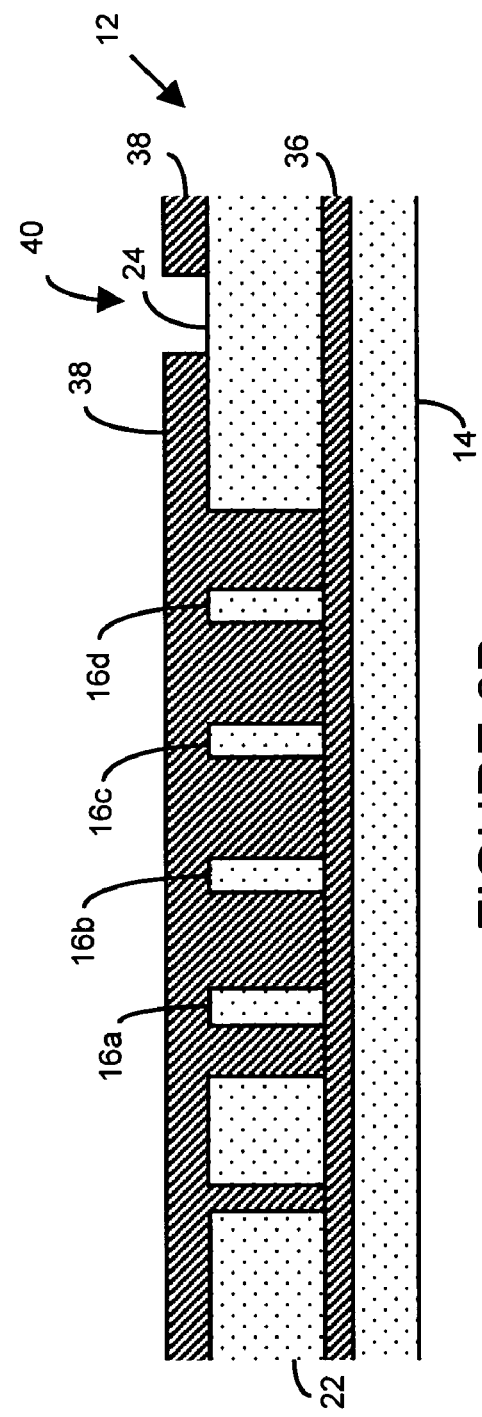

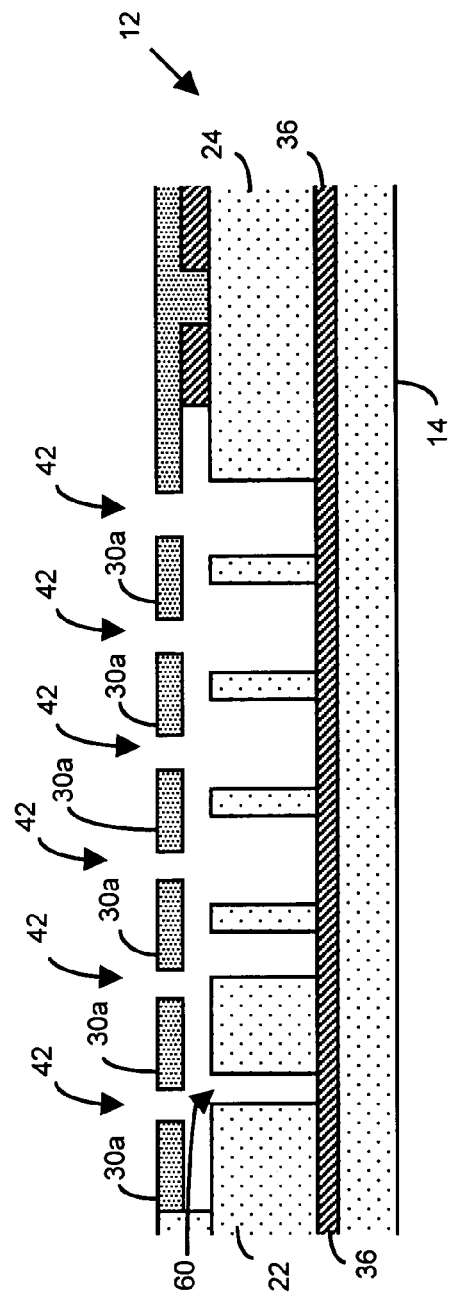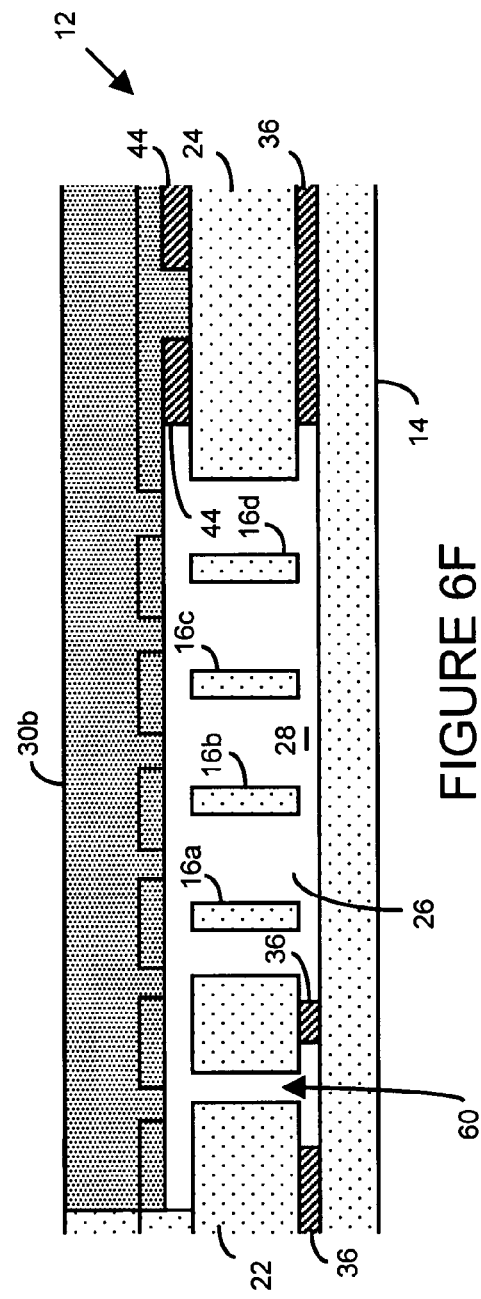

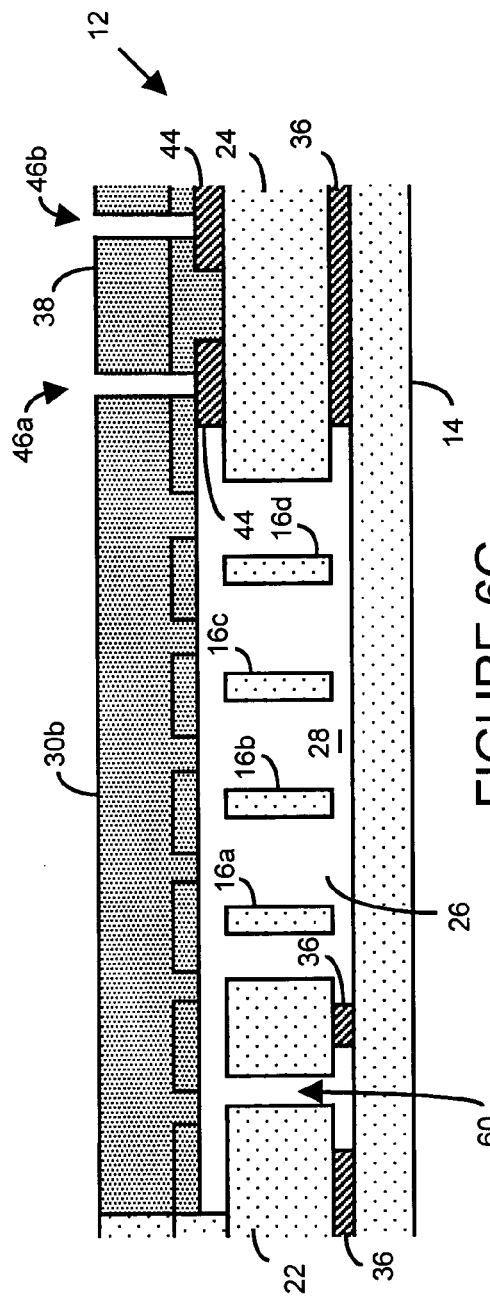
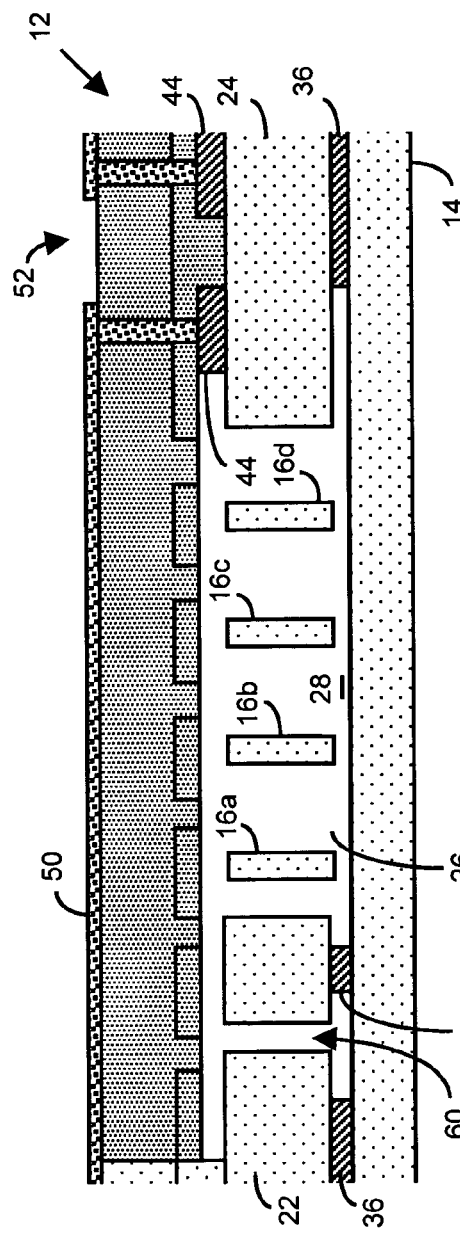
FIGURE 6G
FIGURE 6H

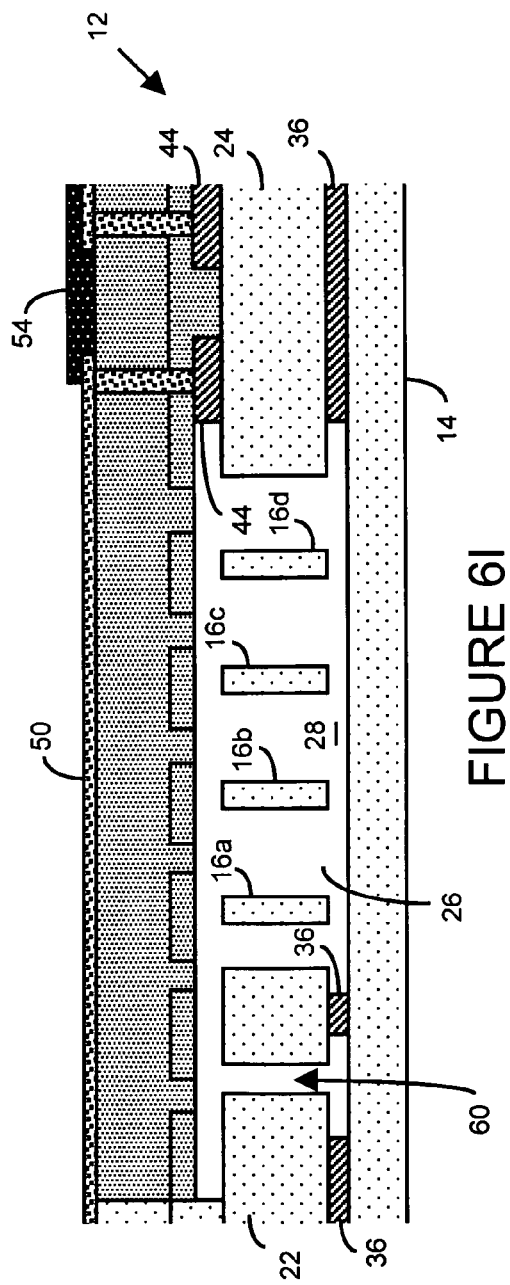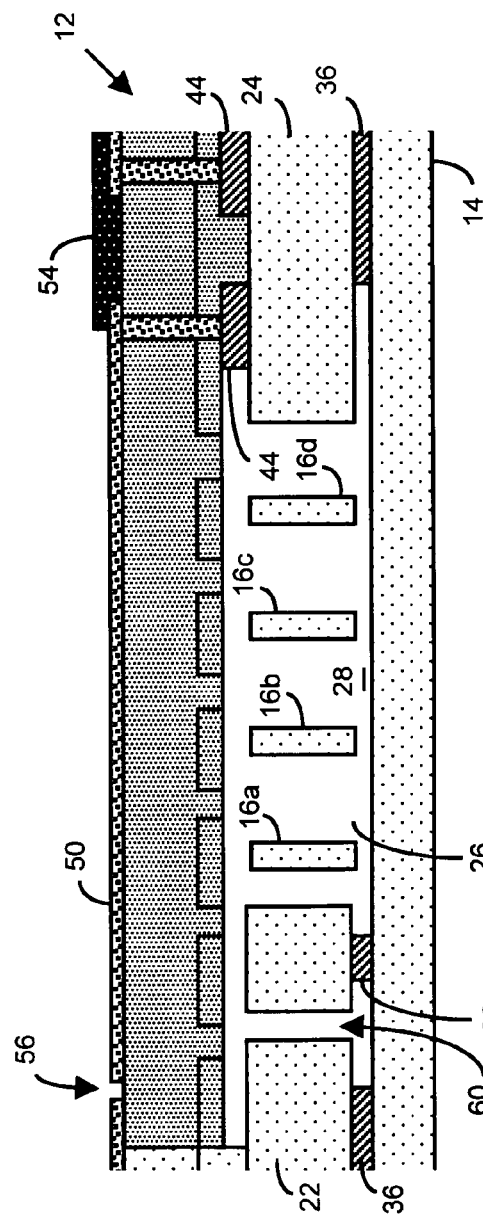

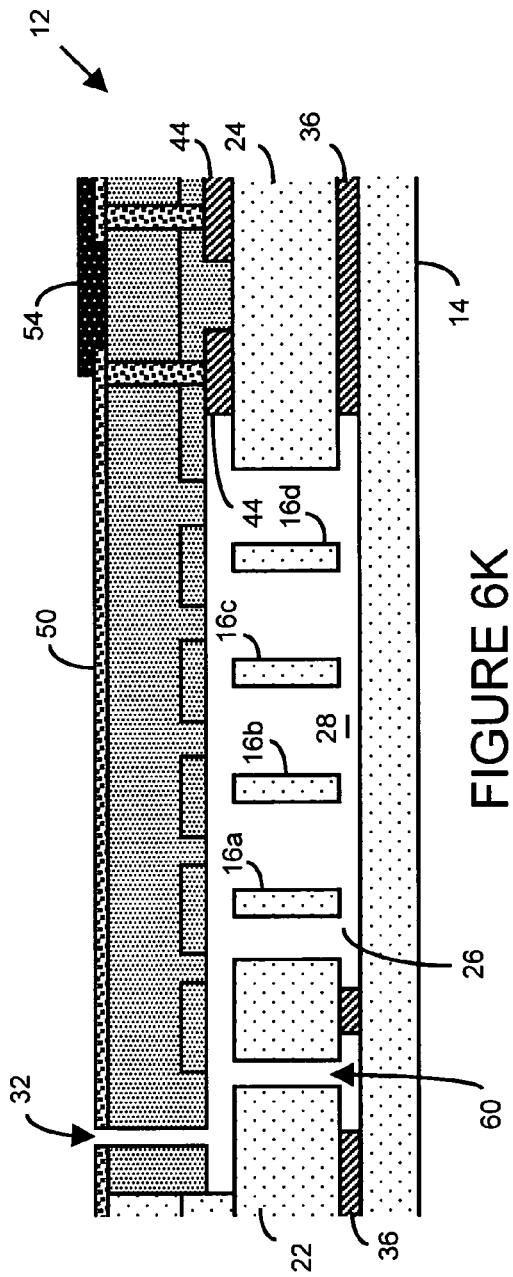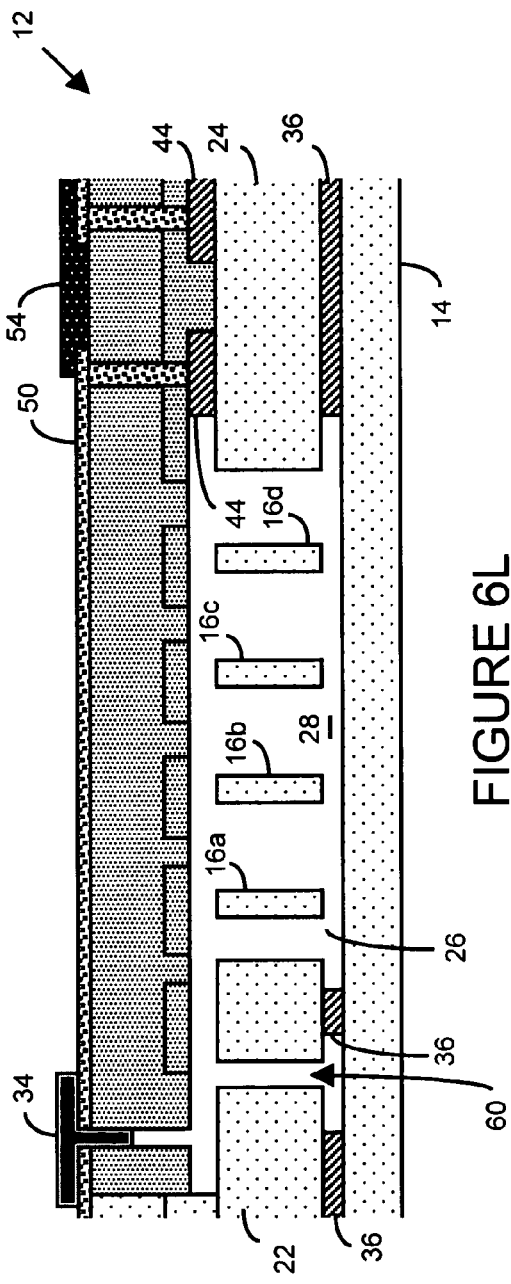

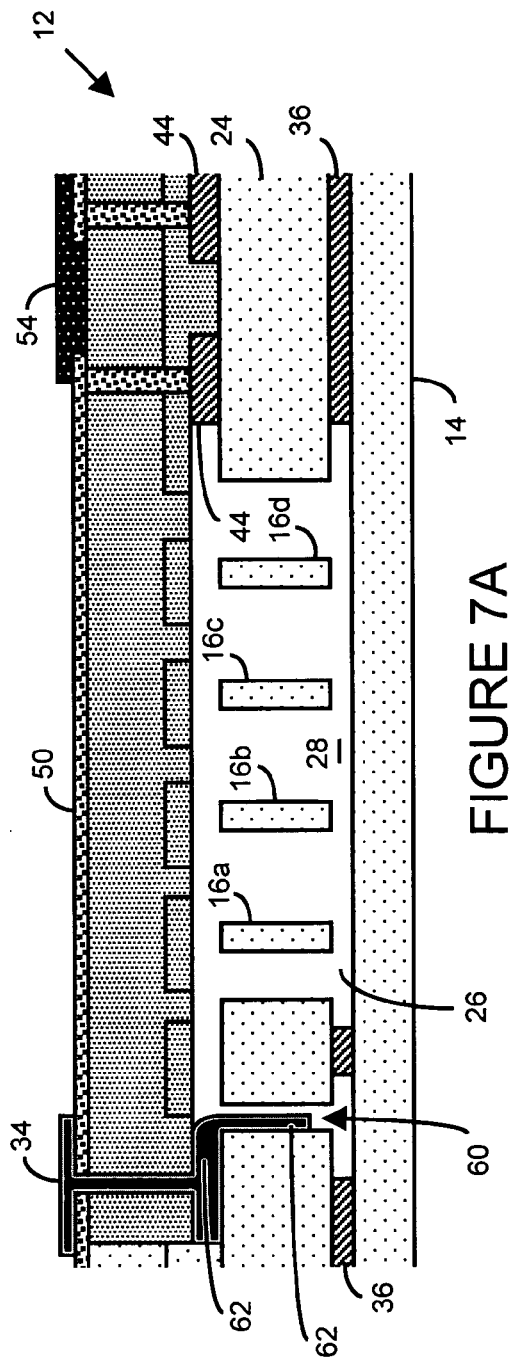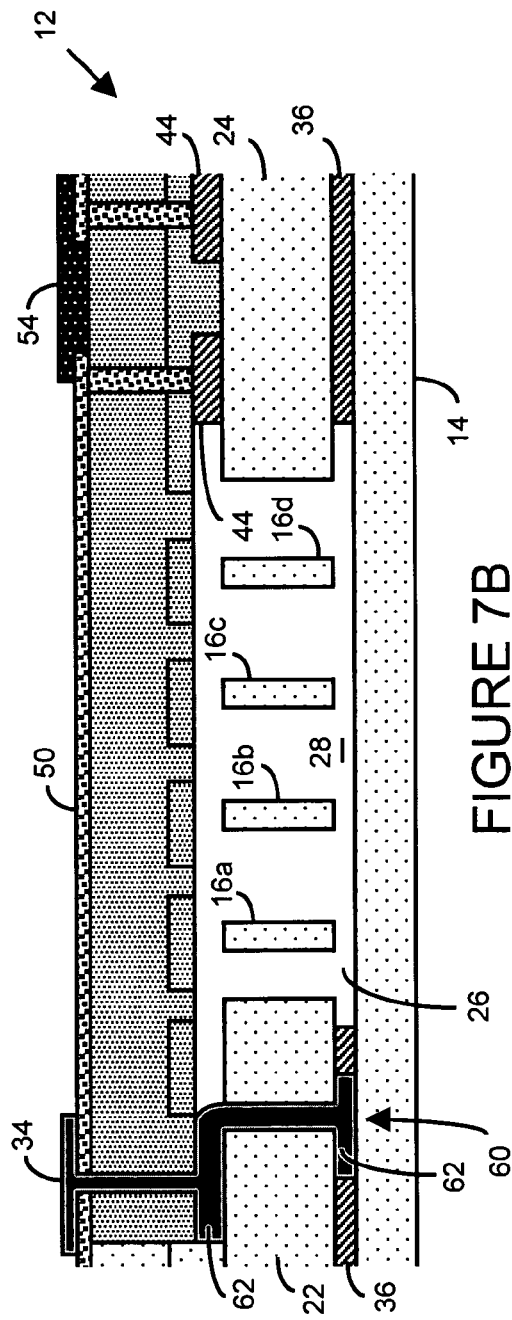

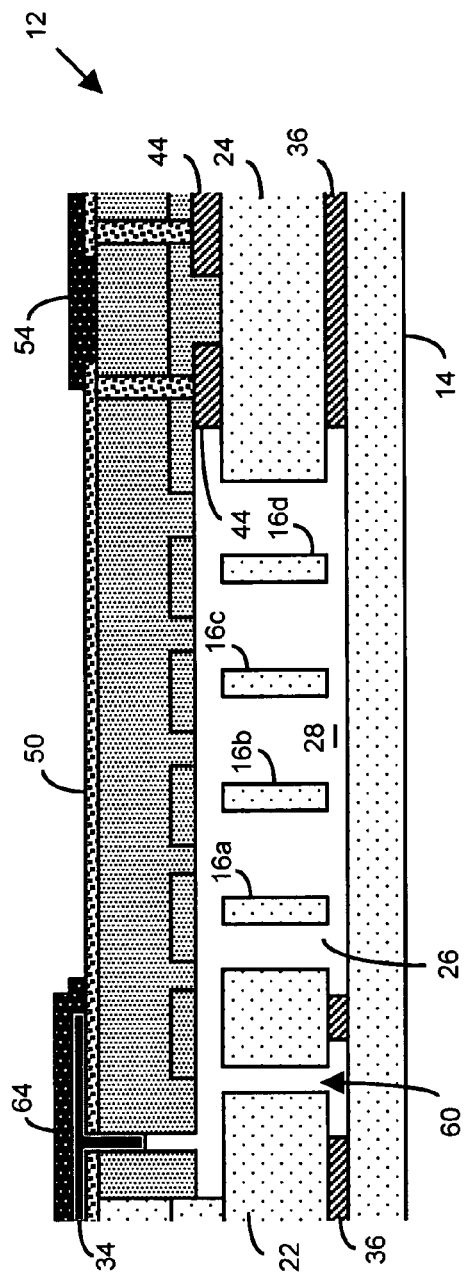
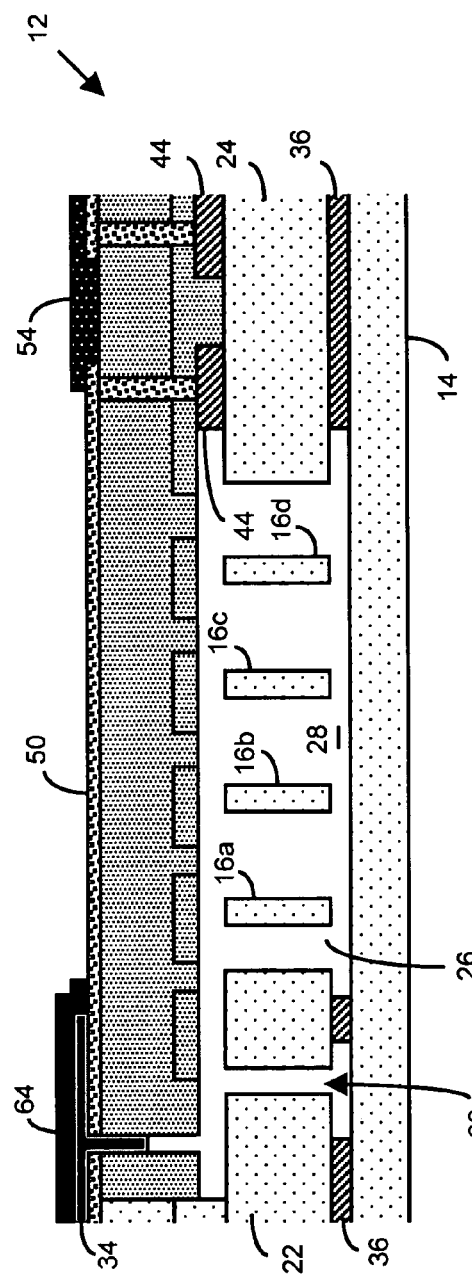
FIGURE 8A
FIGURE 8B

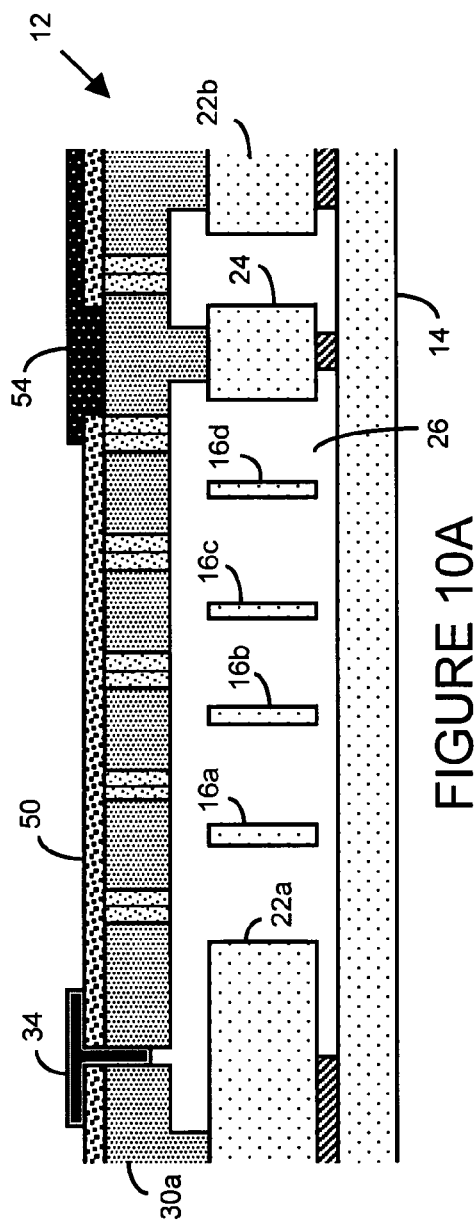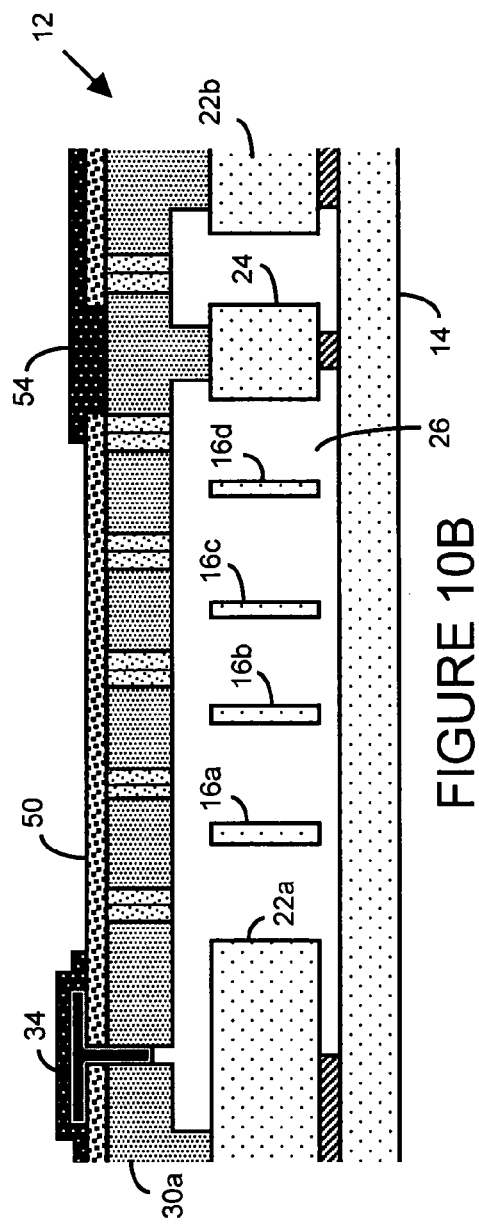
FIGURE 10A
FIGURE 10B

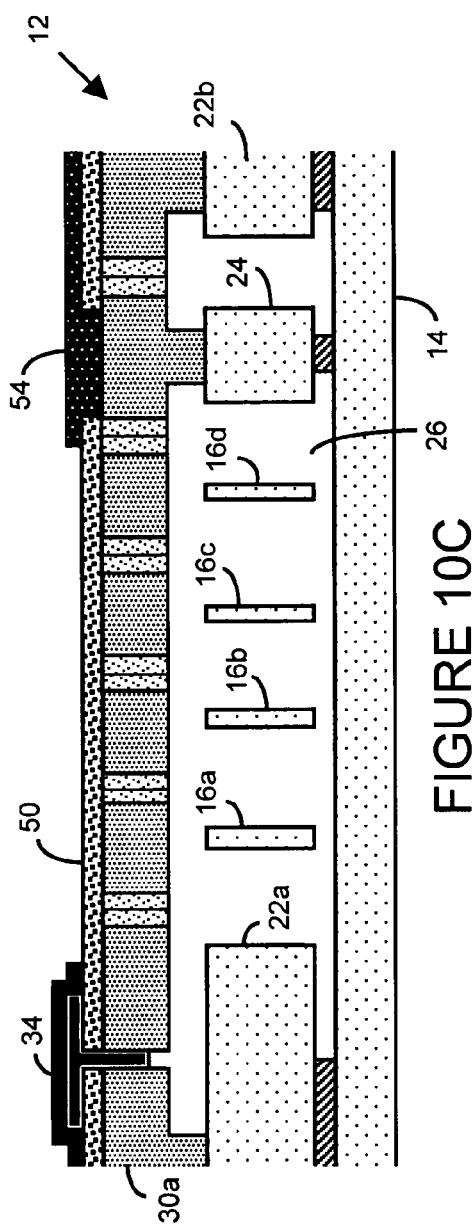
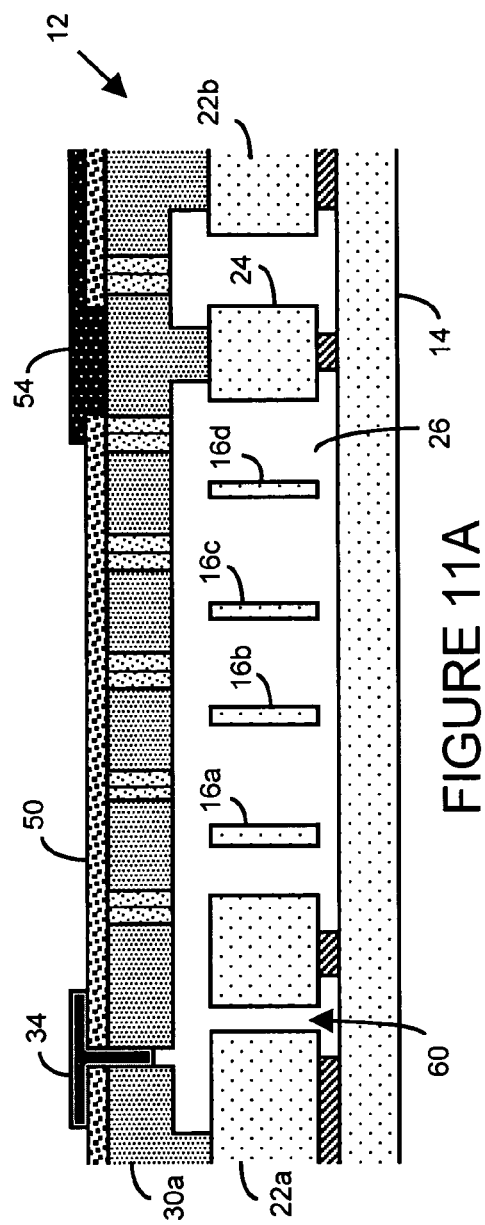

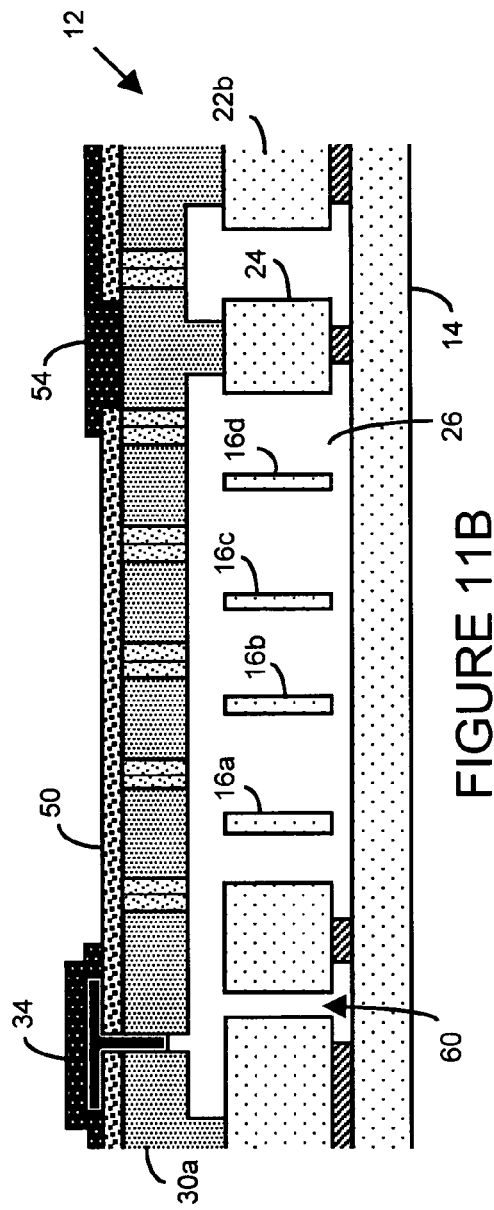
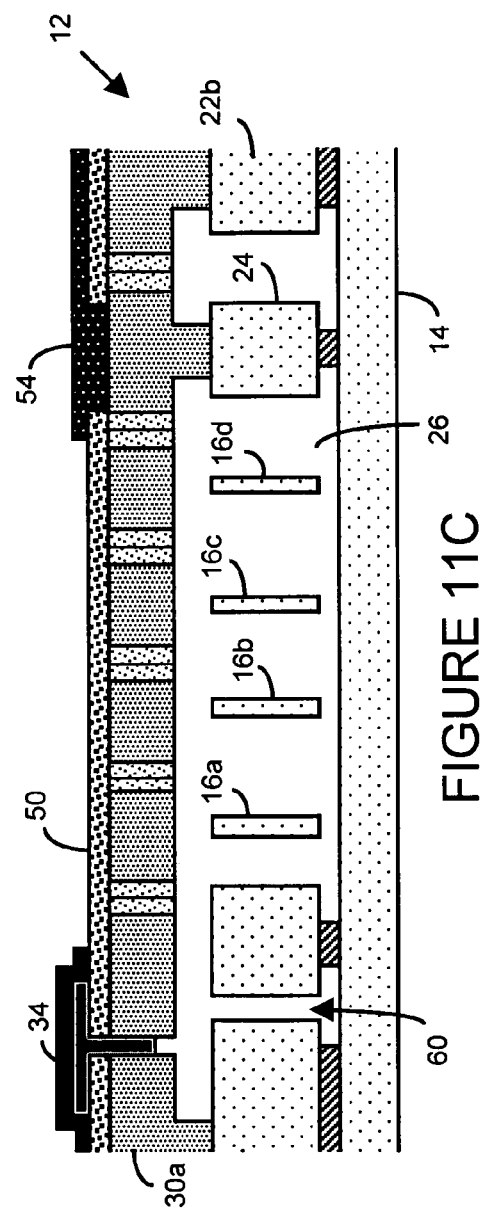
FIGURE 11B
FIGURE 11C

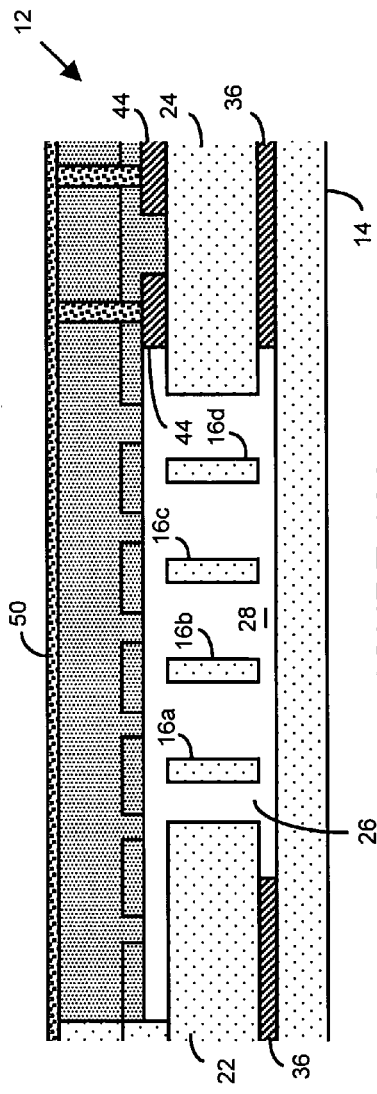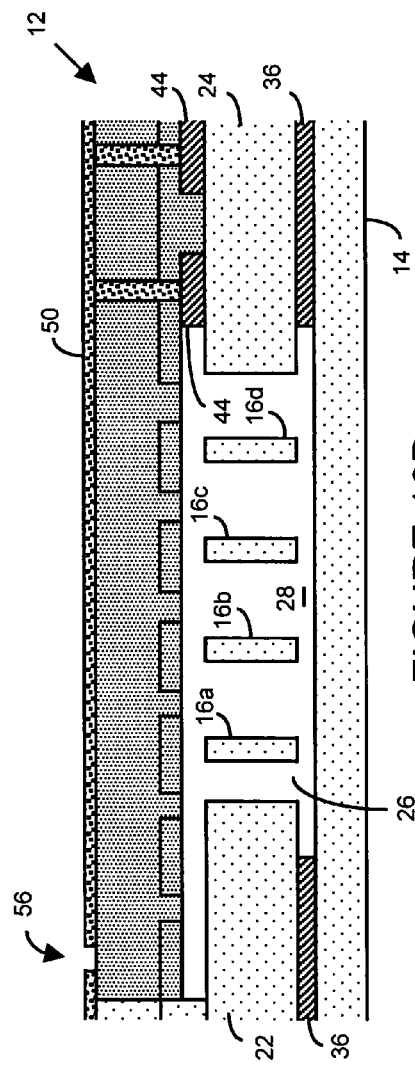

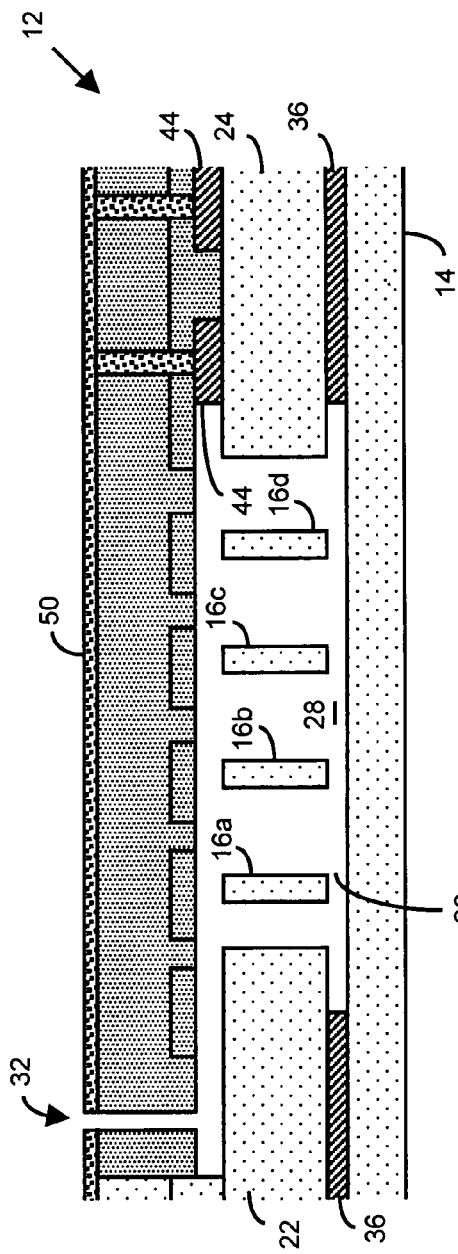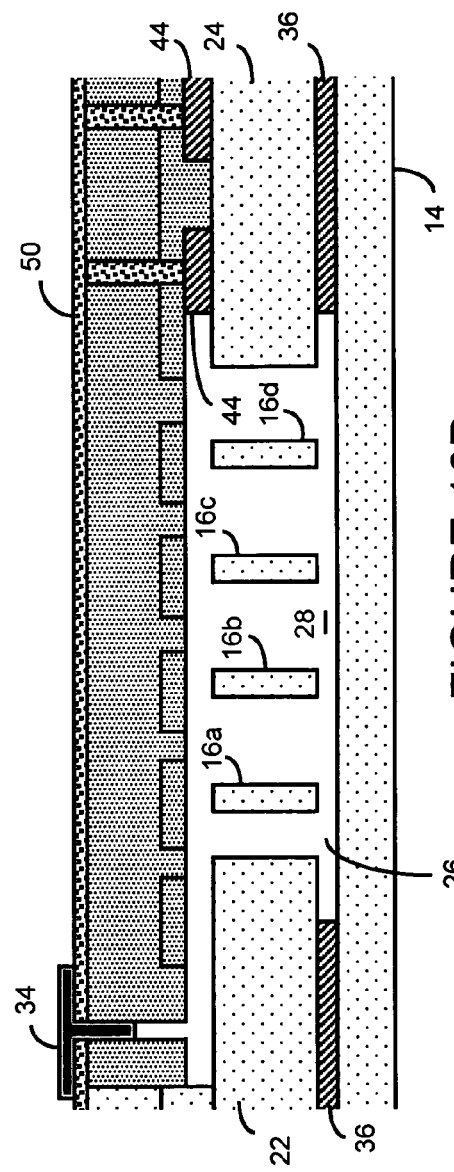

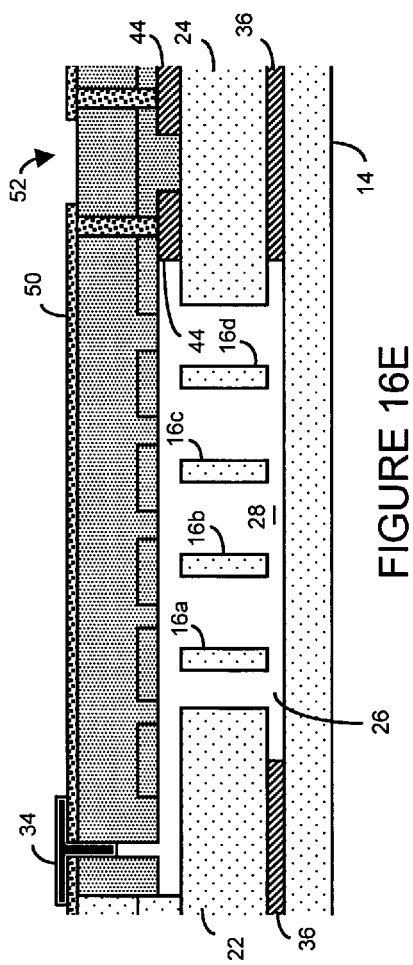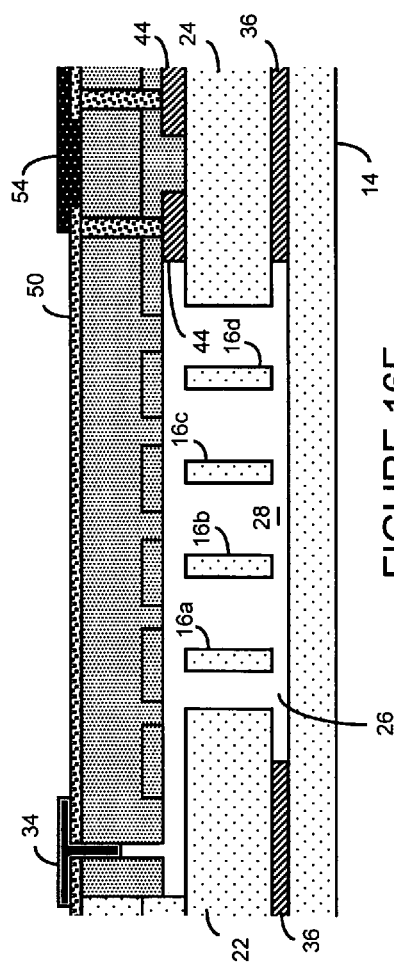

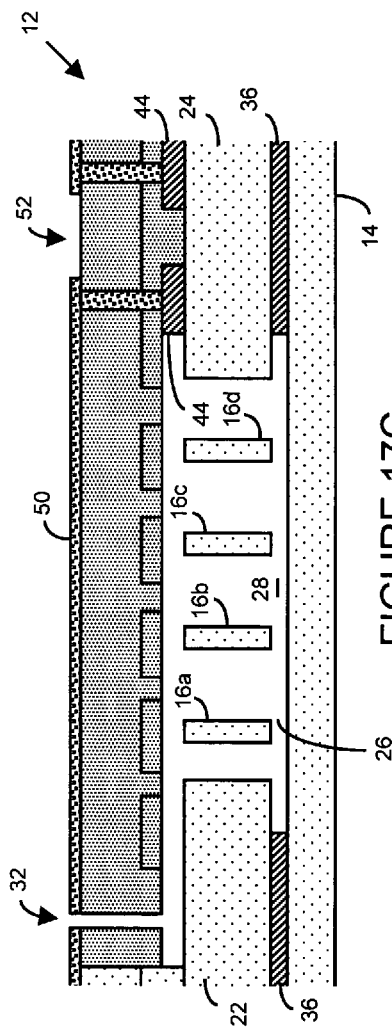
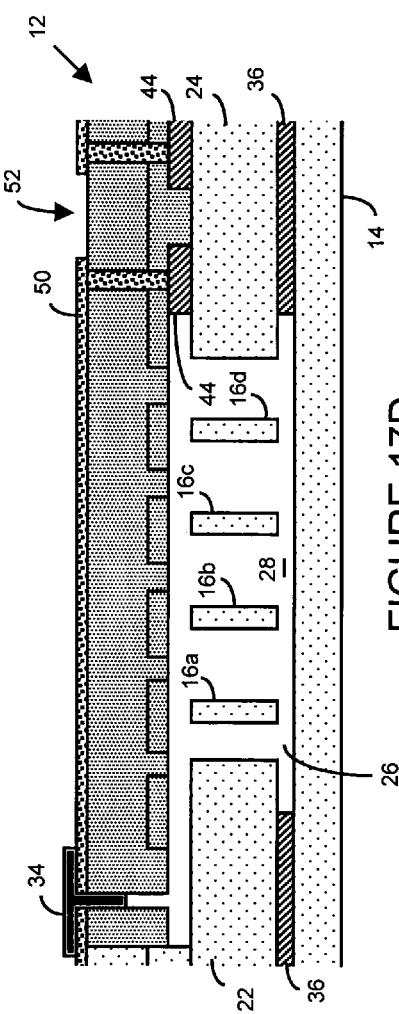
FIGURE 17C
FIGURE 17D

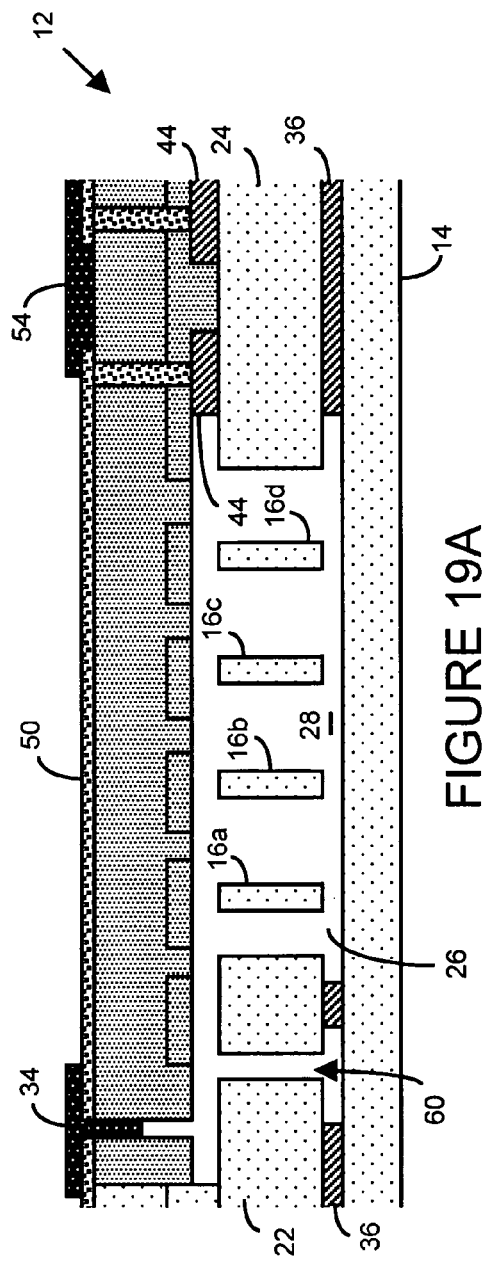
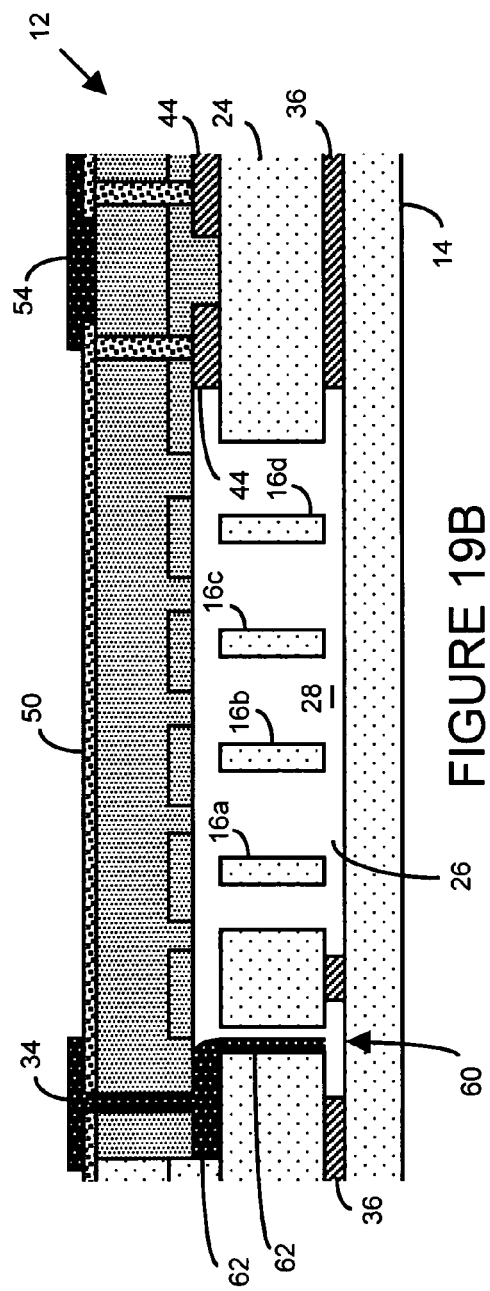
FIGURE 19A
FIGURE 19B

US 7,074,637 B2

ANTI-STICTION TECHNIQUE FOR THIN FILM AND WAFER-BONDED ENCAPSULATED MICROELECTROMECHANICAL SYSTEMS

RELATED APPLICATION

This application is a divisional application of application Ser. No. 10/698,258, filed Oct. 31, 2003, now U.S. Pat. No. 6,930,367, the contents of which are incorporated herein by reference.

This invention relates to electromechanical systems and techniques for fabricating microelectromechanical and/or nanoelectromechanical systems; and more particularly, in one aspect, to fabricating or manufacturing microelectromechanical and nanoelectromechanical systems having mechanical structures that are encapsulated using thin film or wafer bonding encapsulation techniques, and including suitable anti-stiction characteristics.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

MEMS often operate through the movement of certain elements or electrodes, relative to fixed or stationary electrodes, of the mechanical structures. This movement tends to result in a change in gap distances between moving electrodes and stationary or fixed electrodes (for example, the gap between opposing electrodes). (See, for example, U.S. Pat. Nos. 6,240,782, 6,450,029, 6,500,348, 6,577,040, 6,624,726, and U.S. Patent Applications 2003/0089394, 2003/0160539, and 2003/0173864). For example, the MEMS may be based on the position of a deflectable or moveable electrode of a mechanical structure relative to a stationary electrode.

The mechanical structures are typically sealed in a chamber. The delicate mechanical structure may be sealed in, for example, a hermetically sealed metal container (for example, a TO-8 "can", see, for example, U.S. Pat. No. 6,307,815), bonded to a semiconductor or glass-like substrate having a chamber to house, accommodate or cover the mechanical structure (see, for example, U.S. Pat. Nos. 6,146,917; 6,352,935; 6,477,901; and 6,507,082), or encapsulated by a thin film using micromachining techniques during, for example, wafer level packaging of the mechanical structures. (See, for example, International Published Patent Applications Nos. WO 01/77008 A1 and WO 01/77009 A1).

In the context of the hermetically sealed metal container, the substrate on, or in which the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

Thin film wafer level packaging employs micromachining techniques to encapsulate the mechanical structure in a chamber using, for example, a conventional oxide ($SiO_2$) deposited or formed using conventional techniques (i.e., oxidation using low temperature techniques (LTO), tetra-ethoxysilane (TEOS) or the like). (See, for example, WO 01/77008 A1, FIGS. 2–4). When implementing this technique, the mechanical structure is encapsulated prior to packaging and/or integration with integrated circuitry.

Under certain conditions, for example, during operation, the deflectable or moveable electrode may contact the stationary or fixed electrode and the electrodes may become stuck. This may be the result of, for example, rapid, sudden and/or violent movement of the MEMS. When electrodes of a mechanical structure become stuck, it is generally known as stiction. Stiction is common in MEMS and may be caused by, for example, van der Waals force, cold welding, arcing, molecular or atomic bonding, surface tension of, for example, liquids formed on the contacting parts, and/or electrostatic forces due to surface charge. Stiction typically renders the MEMS inoperative.

There are many different and diverse techniques/approaches to address, minimize, overcome and/or avoid the debilitating affects of stiction. (See, for example, U.S. Pat. Nos. 6,621,392, 6,625,047 and 6,625,342 and U.S. Patent Application Nos. 2003/0155643 and 2003/0178635). One approach is to apply a lubricant or passivation layer, for example, perfluorodecanoic acid ("PFDA") on the mechanical structure, including the moveable and fixed electrodes. In this regard, PFDA may be deposited in a monolayer, typically through a vapor deposition, and forms an extremely low energy surface. (See, for example, U.S. Patent Application No. 2003/0161949). This approach is quite common in substrate packaging technique.

In wafer level packaging of mechanical structures, however, the thin encapsulation film is often deposited at high temperatures. In addition, additional or further processing, for example, MEMS integration with electronic circuitry often requires use of high temperature processes (for example, during the formation or fabrication of the integrated circuits). Conventional lubricants or passivation layers are susceptible to destruction when subjected to those temperatures required for fabricating the thin film encapsulation or integrated circuits. Thus, after encapsulation, the mechanical structures are more prone to stiction as a consequence of the post-mechanical structure processing.

There is a need for, among other things, a MEMS employing an anti-stiction technique that is compatible with thin film encapsulation and/or wafer bonding techniques and overcomes one, some or all of the shortcomings of the conventional anti-stiction techniques. There is a need for, among other things, a MEMS including mechanical structures that is encapsulated using thin film encapsulation and/or wafer bonding techniques, that possesses suitable anti-stiction techniques and overcomes the cost, design, operation and/or manufacturing shortcomings of conventional anti-stiction techniques. There is a need for a MEMS having low adhesion energy mechanical structures that are encapsulated using wafer level thin film and/or wafer bonding encapsulation techniques.

SUMMARY OF THE INVENTION

There are many inventions described and illustrated herein. In a first principal aspect, the present invention is a method of manufacturing an electromechanical device having a mechanical structure that is disposed in a sealed chamber which is formed, at least in part, by an encapsulation layer. The method comprises forming at least one anti-stiction channel through the encapsulation layer and introducing an anti-stiction fluid (for example, DDMS, OTS, PFOTCS, PFDA, FDTS, PFPE or FOTS) into the chamber via the anti-stiction channel wherein the anti-stiction fluid forms a monolayer or self-assembled layer on at least a portion of the mechanical structure. The method further includes depositing an anti-stiction plug (for example, spin-on polymer, SOG or a metal material) over or in the anti-stiction channel to re-seal the chamber.

The anti-stiction channel may be formed using anisotropic etching (for example, using reactive ion etching). The anti-stiction plug may be deposited using silk screening, shadow mask technology, or dispensed seal-glass, plastic or epoxy.

In one embodiment, the electromechanical device further includes a contact area and the method further includes forming a trench around the contact area, wherein the contact area is at least partially disposed outside the chamber, and depositing a first insulating material in the trench to electrically isolate the contact area. The method may also include depositing a second insulating layer over at least a portion of the trench and forming an anti-stiction window in the insulating layer before forming the at least one anti-stiction channel through the encapsulation layer. A highly conductive material may be deposited on the contact area and over the second insulating layer to provide electrical connection to the contact area wherein at least a portion of the anti-stiction plug is comprised of the highly conductive material.

In one embodiment, the method includes depositing a diffusion barrier on the anti-stiction plug. The diffusion barrier may be, for example, comprised of a polysilicon, germanium, silicon/germanium, silicon dioxide, silicon nitride, BPSG, PSG, SOG or metal bearing material. Indeed, a highly conductive material deposited on the contact area and over the insulating layer and anti-stiction plug may provide a barrier to diffusion for the chamber and electrical interconnection for the contact area.

Notably, the trench may be formed simultaneously with the forming of the anti-stiction channel(s) through the encapsulation layer.

In second principal aspect, the present invention is a method of manufacturing an electromechanical device having a mechanical structure which is disposed over a substrate and in a sealed chamber which is formed, at least in part, by an encapsulation structure. The method comprises forming at least one anti-stiction channel (for example, using anisotropic etching) through the substrate and introducing an anti-stiction fluid (for example, DDMS, OTS, PFOTCS, PFDA, FDTS, PFPE or FOTS) into the chamber via the at least one anti-stiction channel wherein the anti-stiction fluid forms a monolayer or self-assembled layer on at least a portion of the mechanical structure. The method of this aspect of the invention also includes depositing an anti-stiction plug (for example, spin-on polymer, SOG or a metal material) over or in the anti-stiction channel to re-seal the chamber.

The method may also include securing the encapsulation structure over the mechanical structure using anodic bonding. The encapsulation structure includes an anodic shield and an insulation layer, which is disposed on a cap wafer. The anodic shield may be disposed on the insulation layer.

The anti-stiction plug may be deposited using silk screening, shadow masking technology, or dispensed seal-glass, plastic and/or epoxy.

In one embodiment of this aspect of the invention, the electromechanical device may include a contact area and the method further includes forming a trench around the contact area, wherein the contact area is at least partially disposed outside the chamber, and depositing a first insulating material in the trench to electrically isolate the contact area. The method may also include depositing a second insulating layer over at least a portion of the trench and forming an anti-stiction window in the insulating layer before forming the at least one anti-stiction channel through the encapsulation layer. A highly conductive material may be deposited on the contact area and over the second insulating layer to provide electrical connection to the contact area wherein at least a portion of the anti-stiction plug is comprised of the highly conductive material.

In one embodiment, the method includes depositing a diffusion barrier on the anti-stiction plug. The diffusion barrier may be, for example, comprised of a polysilicon, germanium, silicon/germanium, silicon dioxide, silicon nitride, BPSG, PSG, SOG or metal bearing material. Indeed, a highly conductive material deposited on the contact area and over the insulating layer, and anti-stiction plug may provide a barrier to diffusion for the chamber and electrical interconnection for the contact area.

In a third principal aspect, the present invention is an electromechanical device comprising a substrate, a mechanical structure disposed over the substrate wherein a monolayer or self-assembled layer is disposed on at least a portion of the mechanical structure, and a film encapsulation structure, disposed over the mechanical structure, to define and seal a chamber. In addition, the electromechanical device includes an anti-stiction channel, etched into the film encapsulation structure, to provide access to at least a portion of the mechanical structure disposed in the chamber; and an anti-stiction plug (for example, spin-on polymer, SOG or a metal material), disposed over or in the anti-stiction channel, to re-seal the chamber.

In one embodiment, the film encapsulation structure may include first and second encapsulation layers. The first encapsulation layer may be comprised of polycrystalline silicon, porous polycrystalline silicon, amorphous silicon, silicon carbide, silicon nitride, silicon/germanium, germanium, or gallium arsenide. The second encapsulation layer may be comprised of polycrystalline silicon, porous polycrystalline silicon, amorphous silicon, germanium, silicon/germanium, gallium arsenide, or silicon carbide.

In another embodiment, the electromechanical device may include a trap, disposed between the anti-stiction channel and the mechanical structure. The trap may be a substantially vertical trap or substantially horizontal trap.

The electromechanical device may also include a diffusion barrier disposed over the anti-stiction plug. The diffusion barrier may be comprised of a metal material.

In a fourth principal aspect, the present invention is an electromechanical device comprising a substrate, a mechanical structure disposed over the substrate wherein a monolayer or self-assembled layer is disposed on at least a portion of the mechanical structure, and a wafer bonded encapsulation structure, disposed over the mechanical structure, to define and seal a chamber. The electromechanical device of this aspect of the invention may also include an anti-stiction channel, etched into the substrate, to provide access to at least a portion of the mechanical structure disposed in the chamber and an anti-stiction plug (for example, spin-on polymer, SOG or a metal material), disposed over or in the anti-stiction channel, to re-seal the chamber.

The encapsulation structure may be secured over the mechanical structure using anodic bonding. As such, the encapsulation structure may include an anodic shield. Moreover, the encapsulation structure may include an insulation layer, which is disposed on a cap wafer, wherein the anodic shield is disposed on the insulation layer.

In one embodiment, the electromechanical device of this aspect may include a trap, disposed between the anti-stiction channel and the mechanical structure. The trap may be a substantially vertical trap or substantially horizontal trap.

The electromechanical device may also include a diffusion barrier disposed over the anti-stiction plug. The diffusion barrier may be comprised of a metal material.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 3A–3L illustrate cross-sectional views of the fabrication of MEMS, including the anti-stiction plug or cap, of FIG. 2 at various stages of the process, according to certain aspects of the present invention;

FIG. 6A–6L illustrate cross-sectional views of the fabrication of the anti-stiction plug or cap of FIG. 5 at various stages of the process, according to certain aspects of the present invention;

FIGS. 7A and 7B illustrate the cross-sectional view of FIG. 5, in conjunction with the material of the anti-stiction plug "captured" by a trap, in accordance with certain aspects of the present invention;

FIGS. 8A and 8B illustrate cross-sectional views of the fabrication of a microstructure and an anti-stiction plug or cap including a diffusion barrier, according to certain aspects of the present invention;

FIGS. 10A–10C and 11A–11C illustrate cross-sectional views (sectioned along dotted line a–a' of FIG. 1) of the portion of the interdigitated or comb-like finger electrode array, contact area of FIG. 1, in conjunction with the anti-stiction plug or cap, among other things, in accordance with certain aspects of the present invention;

FIGS. 16A–16F cross-sectional view (sectioned along dotted line a–a' of FIG. 1) of the portion of the interdigitated or comb-like finger electrode array, contact area and a trench isolated contact, in conjunction with an anti-stiction plug or cap, at various stages of the process, in accordance with another aspect of the present invention;

FIGS. 17A–17E cross-sectional views (sectioned along dotted line a–a' of FIG. 1) of the portion of the interdigitated or comb-like finger electrode array, contact area and a trench isolated contact, in conjunction with an anti-stiction plug or cap, at various stages of the process, in accordance with another aspect of the present invention;

FIGS. 19A and 19B illustrate the cross-sectional view of FIG. 18, in conjunction with a trap, in accordance with certain aspects of the present invention;

DETAILED DESCRIPTION

There are many inventions described and illustrated herein. In one aspect, the present invention is directed to a thin film or wafer encapsulated MEMS, and technique of fabricating or manufacturing a thin film or wafer encapsulated MEMS employing the anti-stiction techniques of the present invention. In one embodiment, after encapsulation of the MEMS, an anti-stiction channel is formed in the encapsulation layer(s) and/or the substrate thereby providing "access" to the chamber containing some or all of the active members or electrodes of the mechanical structures of the MEMS. Thereafter, an anti-stiction fluid (for example, gas or gas-vapor) is introduced into the chamber via the anti-stiction channel. The anti-stiction fluid may deposit on one, some or all of the active members or electrodes of the mechanical structures thereby providing an anti-stiction layer (for example, a monolayer coating or self-assembled monolayer) and/or out-gassing molecules on such members or electrodes. In this way, the mechanical structures include suitable anti-stiction characteristics.

After introduction and/or application of the anti-stiction fluid, the anti-stiction channel may be sealed, capped, plugged and/or closed to define and control the mechanical damping environment within the chamber. In this regard, sealing, capping and/or closing the chamber establishes the environment within the chamber containing and/or housing the mechanical structures. This environment provides the predetermined, desired and/or selected mechanical damping of the mechanical structure as well as suitable hermeticity. The parameters (for example, pressure) of the final encapsulated fluid (for example, a gas or a gas vapor) in which the mechanical structures are to operate may be controlled, selected and/or designed to provide a desired and/or predetermined operating environment.

Figure 1:
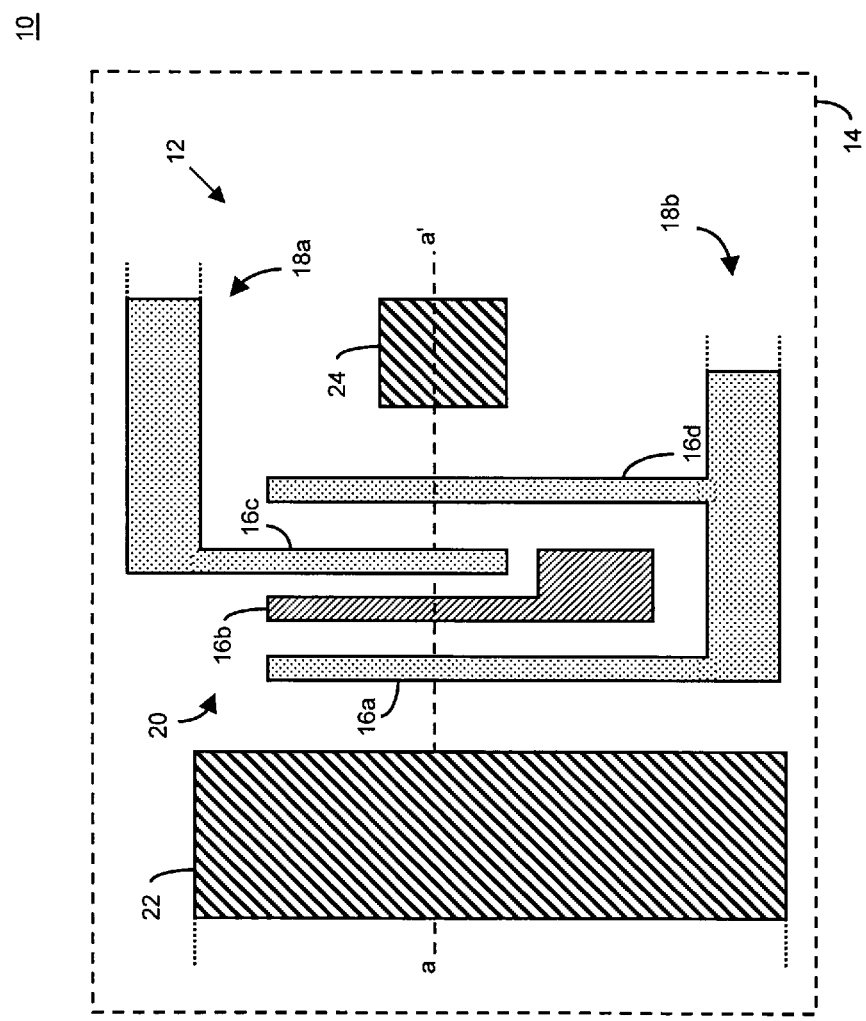
FIG. 1 illustrates a top view of a portion of micromechanical structure, for example, a portion of an interdigitated or comb-like finger electrode array, having "moveable" electrodes and "fixed" electrodes, of an accelerometer, in conjunction with, among other things, a contact area.

With reference to FIG. 1, in one exemplary embodiment, MEMS 10 includes micromachined mechanical structure 12 that is disposed on substrate 14, for example, an undoped semiconductor-like material, a glass-like material, or an insulator-like material. The micromachined mechanical structure 12 may be an accelerometer, gyroscope and/or other transducer (for example, pressure sensor, strain sensor, tactile sensor, magnetic sensor and/or temperature sensor), filter and/or resonator. The micromachined mechanical structure 12 may also include mechanical structures of a plurality of transducers or sensors including, for example, one or more accelerometers, gyroscopes, pressure sensors, tactile sensors and temperature sensors.

Figure 2:
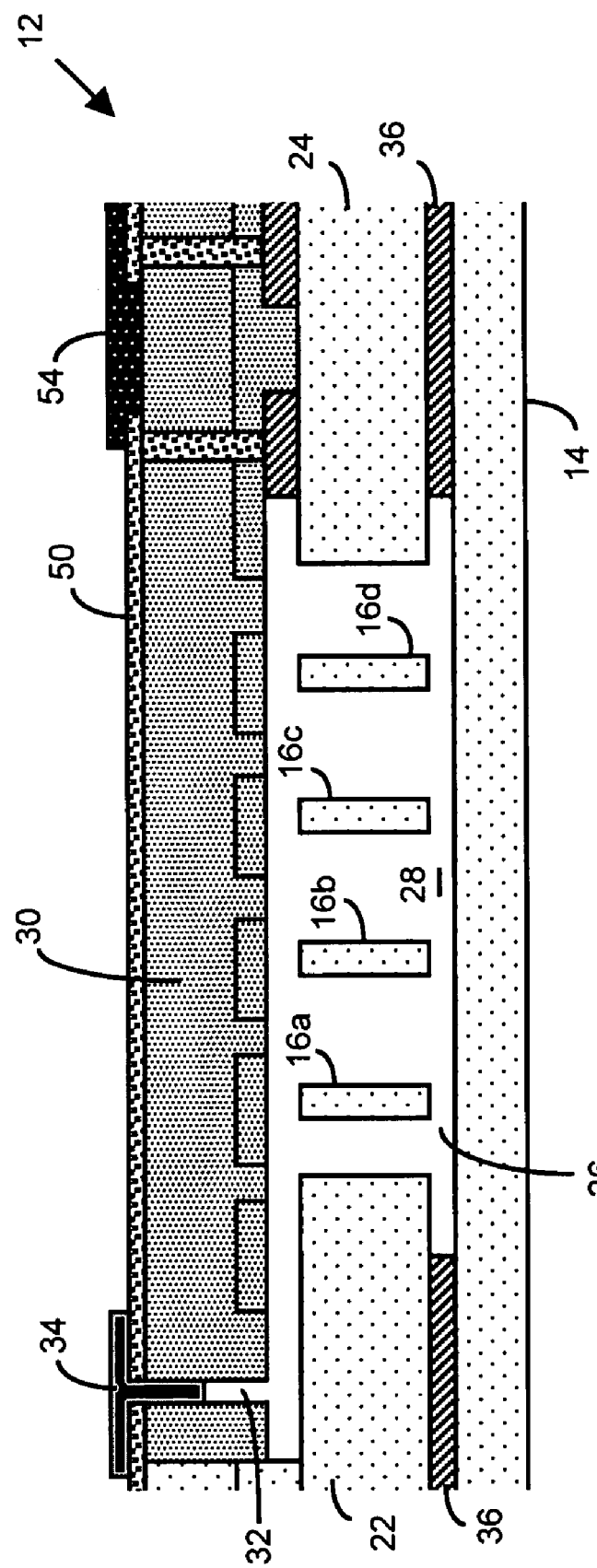
FIG. 2 illustrates a cross-sectional view (sectioned along dotted line a–a' of FIG. 1) of the portion of the interdigitated or comb-like finger electrode array, contact area of FIG. 1 and a trench isolated contact, in conjunction with the anti-stiction plug or cap, in accordance with certain aspects of the present invention.

With reference to FIG. 2, in one embodiment, micromachined mechanical structure 12 includes mechanical structures 16a–d disposed on, above and/or in substrate 14. In particular, mechanical structures 16a, 16c and 16d may be "moveable" electrodes of "moveable" mechanical members 18a and 18b. The mechanical structure 16b may be "fixed" electrodes of "fixed" mechanical member 20. Where micromachined mechanical structure 12 is an accelerometer, mechanical structures 16a–d may be a portion of the interdigitated or comb-like finger electrode arrays that comprise the sensing features of the accelerometer (see, for example, U.S. Pat. No. 6,122,964).

The mechanical structures 16a–d may be comprised of, for example, materials in column IV of the periodic table, for example silicon, germanium, carbon; also combinations of these, for example, silicon germanium, or silicon carbide; also of III–V compounds for example, gallium phosphide, aluminum gallium phosphide, or other III–V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

With continued reference to FIG. 2, micromachined mechanical structure 12 may also include a field area 22 and contact area 24 disposed on or in substrate 14. The field region 22 may provide a substrate material for the electronic or electrical components or integrated circuits (for example, transistors, resistors, capacitors, inductors and other passive or active elements). The contact area 24 may provide an electrical path between micromachined mechanical structure 12 and integrated or external electronics, integrated interface circuitry, and/or an external device (not illustrated). The contact area 24 may be comprised of, for example, silicon, (whether doped or undoped), germanium, silicon/germanium, silicon carbide, and gallium arsenide, and combinations and/or permutations thereof.

The micromachined mechanical structure 12 further includes chamber 26 having an atmosphere 28 "contained" therein. The chamber 26 is formed, at least in part, by encapsulation layer(s) 30. In this regard, MEMS 10 may be sealed in chamber 26 using conventional thin film encapsulation techniques and structures. (See, for example, WO 01/77008 A1 and WO 01/77009 A1). Other thin film encapsulation techniques are suitable. Indeed, all thin film encapsulation techniques, whether now known or later developed, are intended to be within the scope of the present invention.

For example, the encapsulation techniques described and illustrated in non-provisional patent application entitled "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts Patent Application"), may be employed in conjunction with the anti-stiction techniques of the present invention. For the sake of brevity, the inventions described and illustrated in the Microelectromechanical Systems Having Trench Isolated Contacts Patent Application, implemented in conjunction with the inventions described and illustrated herein, will not be repeated but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

The micromachined mechanical structure 12 of the present invention also includes anti-stiction channel 32 formed through, for example, encapsulation layer(s) 30 to facilitate fluid communications with and/or provide an access or a pathway to mechanical structures 16a–d in chamber 26 after completion of the encapsulation process (i.e., deposition, formation and/or growth of encapsulation layer(s) 30). In this regard, after encapsulation of mechanical structures 16a–d and formation of chamber 26, anti-stiction channel 32 may be formed using, for example, anisotropic etching techniques (for example, deep reactive ion etching). In one embodiment, "diameter" or "width" of anti-stiction channel 32 may be between 100 nm to 50 µm and preferably between 200 nm and 10 µm. Notably, the "diameter" or "width" of anti-stiction channel 32 may depend on the thickness of the encapsulation layer(s) 30.

Thereafter, an anti-stiction fluid (for example, dichlordimethylsilan ("DDMS"), octadecyltrichlorsilan ("OTS"), perfluoroctyltrichlorsilan ("PFOTCS"), perfluorodecanoic acid ("PFDA"), perfluorodecyl-trichlorosilane ("FDTS"), perfluoro polyether ("PFPE") and/or fluoroalkylsilane ("FOTS")) may be introduced into chamber 26 by, for example, vapor deposition (for example, APCVD, LPCVD, or PECVD). The anti-stiction fluid may deposit on one, some or all of mechanical structures 16a–d of MEMS 12 thereby providing an anti-stiction layer, for example, a monolayer coating and/or out-gassing molecules on the mechanical structures. In this way, mechanical structures 16a–d include suitable anti-adhesive properties.

The parameters of introducing the anti-stiction fluid may impact, for example, the characteristics of the anti-stiction layer (for example, the monolayer or self-assembled monolayer) on mechanical structures 16a–d. For example, introducing the anti-stiction fluid at higher temperatures may tend to enhance the diffusivity of the fluid whereas introducing the anti-stiction fluid at lower temperatures may tend to enhance the anti-stiction properties of the fluid. Thus, in one embodiment, the anti-stiction fluid is introduced between 20° C. to 600° C., and preferably between 100° C. and 300° C.

Moreover, introducing the anti-stiction fluid at higher pressures may tend to enhance the deposition rate of the anti-stiction layer (for example, the monolayer or self-assembled monolayer) on mechanical structures 16a–d. In contrast, lower pressures may increase the number of molecules that enter further down into chamber 26 due to the larger mean free path of the molecules via anti-stiction channel 32. Thus, in one embodiment, the anti-stiction fluid is introduced between 100 µTorr and 1 Torr.

It may be advantageous to employ deposition parameters of the anti-stiction layer that provides or forms the anti-stiction layer more conformally. In this way, anti-stiction channel 32 is less likely to close, as a result of "build-up" of the anti-stiction material within or above anti-stiction channel 32, before a sufficient anti-stiction layer forms on mechanical structures 16a–d. Notably, the anti-stiction fluid may be any material that enhances the non-reactive and/or non-adhesive nature of, for example, the surface of mechanical structures 16a–d.

The anti-stiction channel 32 may be "closed" and/or "sealed" via channel plug 34. In this regard, channel plug 34 may be any material that seals, plugs and/or closes anti-stiction channel 32. For example, channel plug 34 may be a spin-on polymer, spin-on glass ("SOG"), metal material (for example, metal that is sputtered and, if necessary patterned). Further, channel plug 34 may be formed using/from silk screening of or dispensed seal-glass, plastic and/or epoxy. In addition, a shadow mask technology may be employed to seal, plug and/or close anti-stiction channel 32. Indeed, any material (and corresponding fabrication technique) may be implemented that, in one embodiment, provides a barrier to maintain a suitable environment in chamber 26 and is formed, applied and/or grown using parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction characteristics. In this way, after sealing and/or closing anti-stiction channel 32, mechanical structures 16a–d retain suitable anti-stiction characteristics and/or properties.

As mentioned above, an exemplary method of fabricating or manufacturing a thin film encapsulated MEMS 10 is described and illustrated in the Microelectromechanical Systems Having Trench Isolated Contacts Patent Application. For the sake of brevity, those discussions and illustrations will not be repeated but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

With reference to FIG. 3A, MEMS 10 may begin with an SOI substrate partially formed device including mechanical structures 16a–d and contact area 24 disposed on first sacrificial layer 36, for example, silicon dioxide or silicon nitride. The mechanical structures 16a–d and contact area 24 may be formed using well-known deposition, lithographic, etching and/or doping techniques as well as from well-known materials (for example, semiconductors such as silicon, germanium, silicon-germanium or gallium-arsenide). Moreover, field region 22 and first sacrificial layer 36 may be formed using well-known silicon-on-insulator fabrication techniques (FIG. 3A) or well-known formation, lithographic, etching and/or deposition techniques using a standard or over-sized ("thick") wafer (not illustrated).

With reference to FIG. 3B, following formation of mechanical structures 16a–d and contact area 24, second sacrificial layer 38, for example, silicon dioxide or silicon nitride, may be deposited and/or formed to secure, space and/or protect mechanical structures 16a–d during subsequent processing, including the encapsulation process. In addition, an opening 40 may be etched and/or formed in second sacrificial layer 38 to provide for subsequent formation of an electrical contact. The opening 40 may be provided using, for example, well known masking techniques (such as a nitride mask) prior to and during deposition and/or formation of second sacrificial layer 38, and/or well known lithographic and etching techniques after deposition and/or formation of second sacrificial layer 38.

With reference to FIGS. 3C, 3D and 3E, thereafter, first encapsulation layer 30a may be deposited, formed and/or grown on second sacrificial layer 38 (see, FIG. 3C). In one embodiment, the thickness of first encapsulation layer 30a in the region overlying second sacrificial layer 38 may be between 0.1 µm and 5.0 µm. The external environmental stress on, and internal stress of first encapsulation layer 30a after etching second sacrificial layer 38 may impact the thickness of first encapsulation layer 30a. Slightly tensile films may self-support better than compressive films which may buckle.

The first encapsulation layer 30a may be etched to form passages or vents 42 (see, FIG. 3D). In one exemplary embodiment, vents 42 have a diameter or aperture size of between 0.1 µm to 2 µm. The vents 42 permit etching and/or removal of at least selected portions of first and second sacrificial layers 36 and 38, respectively (see, FIG. 3E).

As mentioned in the Microelectromechanical Systems Having Trench Isolated Contacts Patent Application, contact 24 may remain partially, substantially or entirely surrounded by portions of first and second sacrificial layers 36 and/or 38. For example, with reference to FIG. 3E, while mechanical structures 16*a*–16*d* are released from their respective underlying oxide columns, a portion 44 of sacrificial layer 38 (i.e., juxtaposed electrical contact area 24 may remain after etching or removing second sacrificial layer 38.

With reference to FIG. 3F, after releasing mechanical elements 16*a*–*d*, second encapsulation layer 30*b* may be deposited, formed and/or grown. The second encapsulation layer 30*b* may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 30*a*.

Thereafter, contact area 24 of micromachined mechanical structure 12 is dielectrically isolated from the surrounding conductor and/or semiconductor layers. With reference to FIGS. 3G and 3H, trenches 46*a* and 46*b* may be etched. The trenches 46*a* and 46*b* may include a slight taper in order to facilitate the formation of dielectric isolation regions 48*a* and 48*b*. In this regard, an insulating material may be deposited in trenches 46*a* and 46*b* to form dielectric isolation regions 48*a* and 48*b*, respectively. The insulating material may be, for example, silicon dioxide, silicon nitride, BPSG, PSG, or SOG.

The insulating layer 50 may be deposited, formed and/or grown on the exposed surface of second encapsulating layer 30*b* to provide insulation between the various surrounding conductive and/or semiconductor layers and the subsequent conductive layer. Thus, during deposition, formation and/or growth of insulation layer 50, trenches may also be filled to form dielectric isolation regions 48*a* and 48*b*. (see, FIG. 3H). Thereafter, contact opening 52 may be etched to facilitate electrical connection to contact area 24. A conductive layer 54 may then be deposited and/or formed to provide the appropriate electrical connection to contact 24. (see, FIG. 3I).

Thereafter, with reference to FIG. 3J, anti-stiction channel window 56 may be formed and/or etched in insulation layer 50, using conventional etching techniques, in order to define the location of anti-stiction channel 32 (see, FIG. 3K). The anti-stiction channel 32 is formed through encapsulation layer(s) 30 to provide access to mechanical structures 16*a*–*d*. The anti-stiction channel 32 may be formed using, for example, well-known anisotropic etching techniques (for example, deep reactive ion etching).

After formation of anti-stiction channel 32, an anti-stiction fluid may be introduced into chamber 26. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16*a*–*d* of MEMS 12. In this way, anti-stiction layer 58 (exemplary illustration in FIG. 4), for example, the monolayer coating formed on mechanical structures 16*a*–*d*, remains relatively intact and mechanical structures 16*a*–*d* include suitable anti-adhesive properties to overcome the adhesive forces of adjacent structures or elements in MEMS 10.

With reference to FIG. 3L, anti-stiction channel 32 may be closed via channel plug 34. In this regard, channel plug 34 may be any material that seals, plugs and/or closes anti-stiction channel 32. For example, channel plug 34 may be a spin-on polymer, spin-on glass ("SOG"), metal material that is sputtered and, if necessary patterned. Further, channel plug 34 may be formed using/from silk screening of sealglass, plastic and/or epoxy. In addition, a shadow mask technology may be employed to seal, plug and/or close anti-stiction channel 32. Indeed, any material (and corresponding fabrication technique) may be employed to form channel plug 34 provided the process of forming channel plug 34 uses parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction or anti-adhesive characteristics.

Notably, the anti-stiction fluid may be a gas or gas vapor of a material used during the formation of channel plug 34. Indeed, the anti-stiction fluid may be a by-product of the reaction of the material of MEMS 10 and the gas or gas vapor of a material used during the formation of channel plug 34. For example, a mixture of solvents and/or a polymer which outgases appropriate molecules such as DDMS.

The state of the fluid within chamber 26 (for example, the pressure), after deposition and/or formation of channel plug 34 may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application"). For the sake of brevity, all of the inventions regarding controlling the atmosphere within chamber 26 which are described and illustrated in the Electromechanical System having a Controlled Atmosphere Patent Application will not be repeated here. It is expressly noted, however, that the entire contents of the Electromechanical System having a Controlled Atmosphere Patent Application, including, for example, the features, attributes, alternatives, materials, techniques and advantages of all of the inventions, are incorporated by reference herein.

Figure 4:
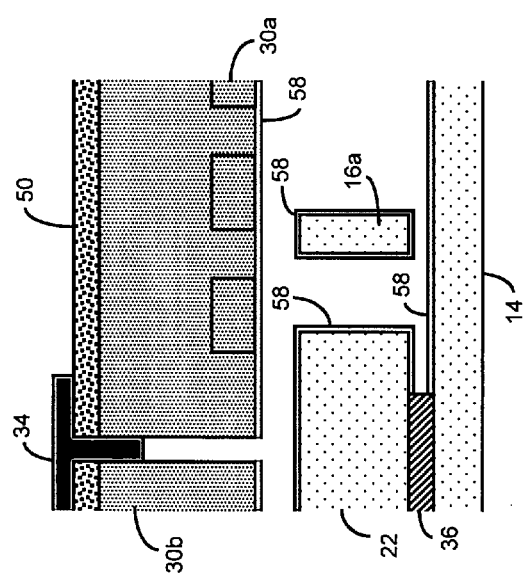
FIG. 4 illustrates a cross-sectional view of the anti-stiction layer deposited on the microstructure of FIG. 2, according to certain aspects of the present invention.

With reference to FIG. 4, in certain embodiments, anti-stiction layer 58, for example, a thin and/or monolayer coating is formed on mechanical structures 16*a*–*d* as a result of the introduction of the anti-stiction fluid and/or formation of channel plug 34. The thin and/or monolayer coating provides suitable anti-adhesive properties that overcome the adhesive forces of adjacent structures or elements in MEMS 10. Notably, anti-stiction layer 58, for example, the thin and/or monolayer coating does not detrimentally impact the operation of mechanical structures 12 of MEMS 10.

Figure 5:
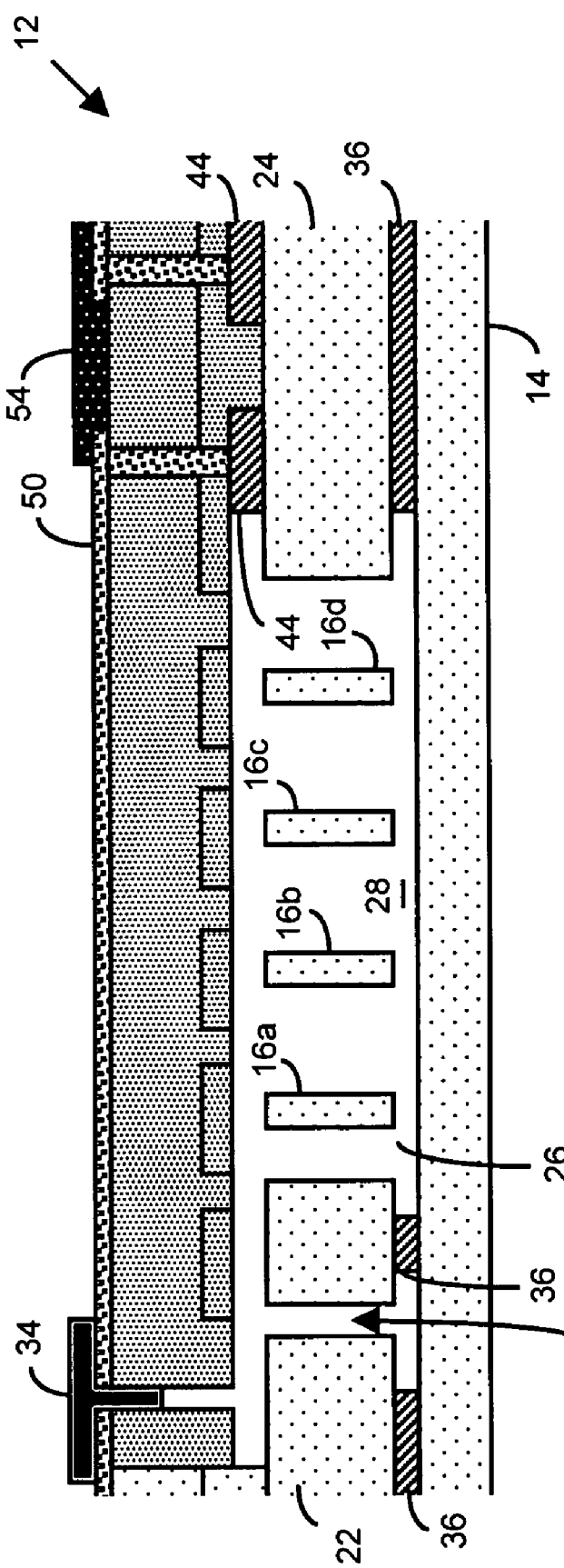
FIG. 5 illustrates a cross-sectional view (sectioned along dotted line a–a' of FIG. 1) of the portion of the interdigitated or comb-like finger electrode array, contact area and a trench isolated contact, in conjunction with a trap and an anti-stiction plug or cap, in accordance with certain aspects of the present invention.

In another embodiment of the present invention, a vertical and/or horizontal trap is formed in the vicinity of anti-stiction channel 32. The trap 60 may be positioned between anti-stiction channel 32 and mechanical structures 16*a*–*d* (see, for example, FIG. 5). In this way, where certain materials (i.e., the material(s) used to form channel plug 34) are employed to seal, plug and/or close anti-stiction channel 32 that may escape from anti-stiction channel 32, trap 60

"captures" or "catches" that material before it enters that portion of chamber 26 where mechanical structures 16*a–d* reside. Under this circumstance, the channel plug material that enters chamber 26 is routed away from mechanical structures 16*a–d* and, as such, is "prevented" from contacting and/or impacting mechanical structures 16*a–d* and the operation thereof. For example, with reference to FIG. 5, trap 60 may be a substantially vertical trap, which is located between anti-stiction channel 32 and mechanical structures 16*a–d*.

Figure 6C:
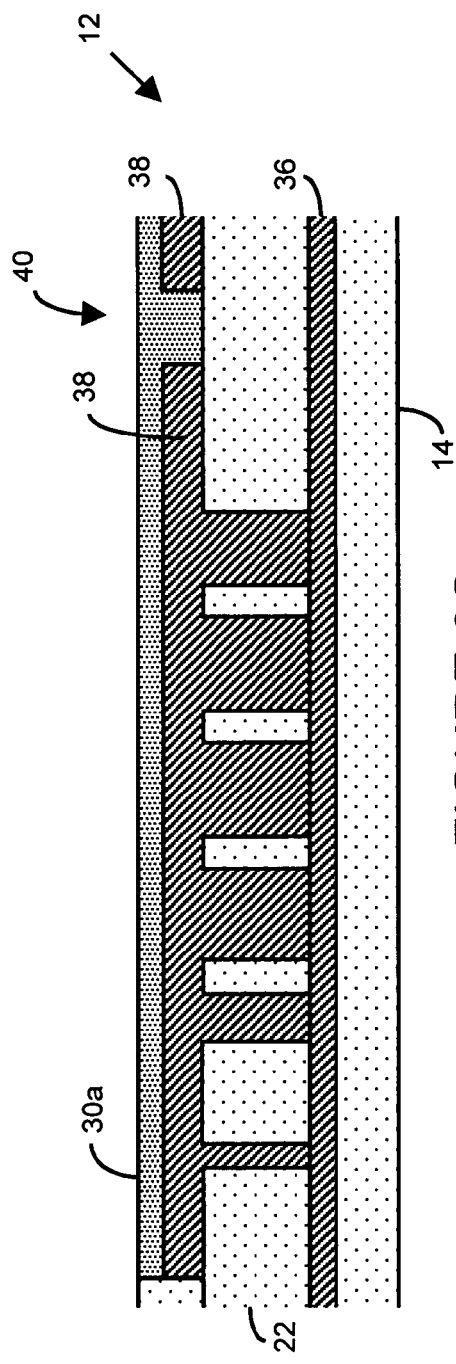
Figure 6D:
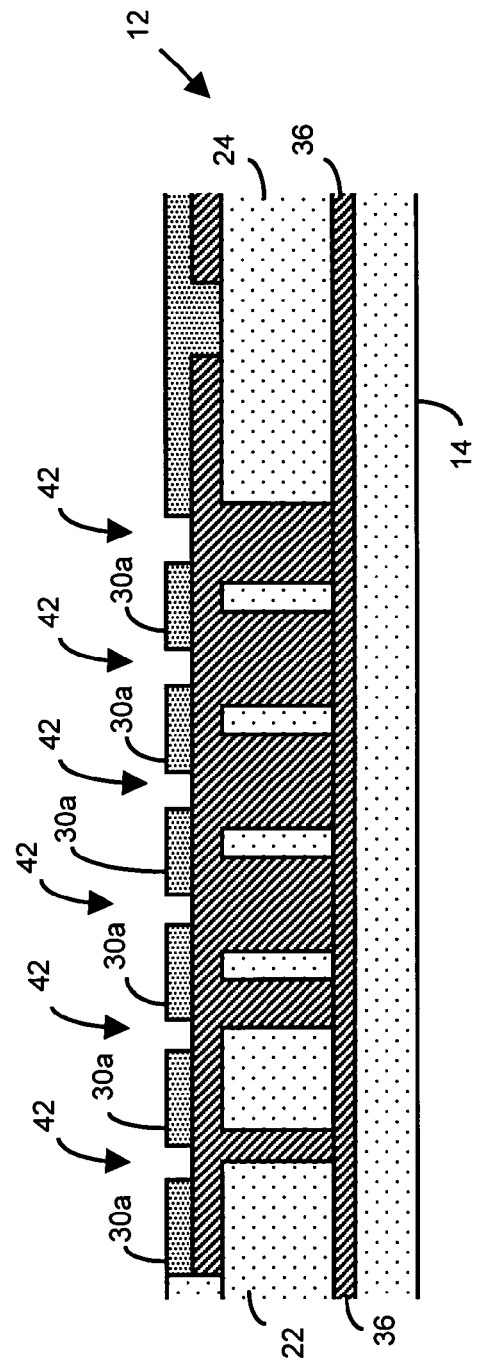
Figure 9:
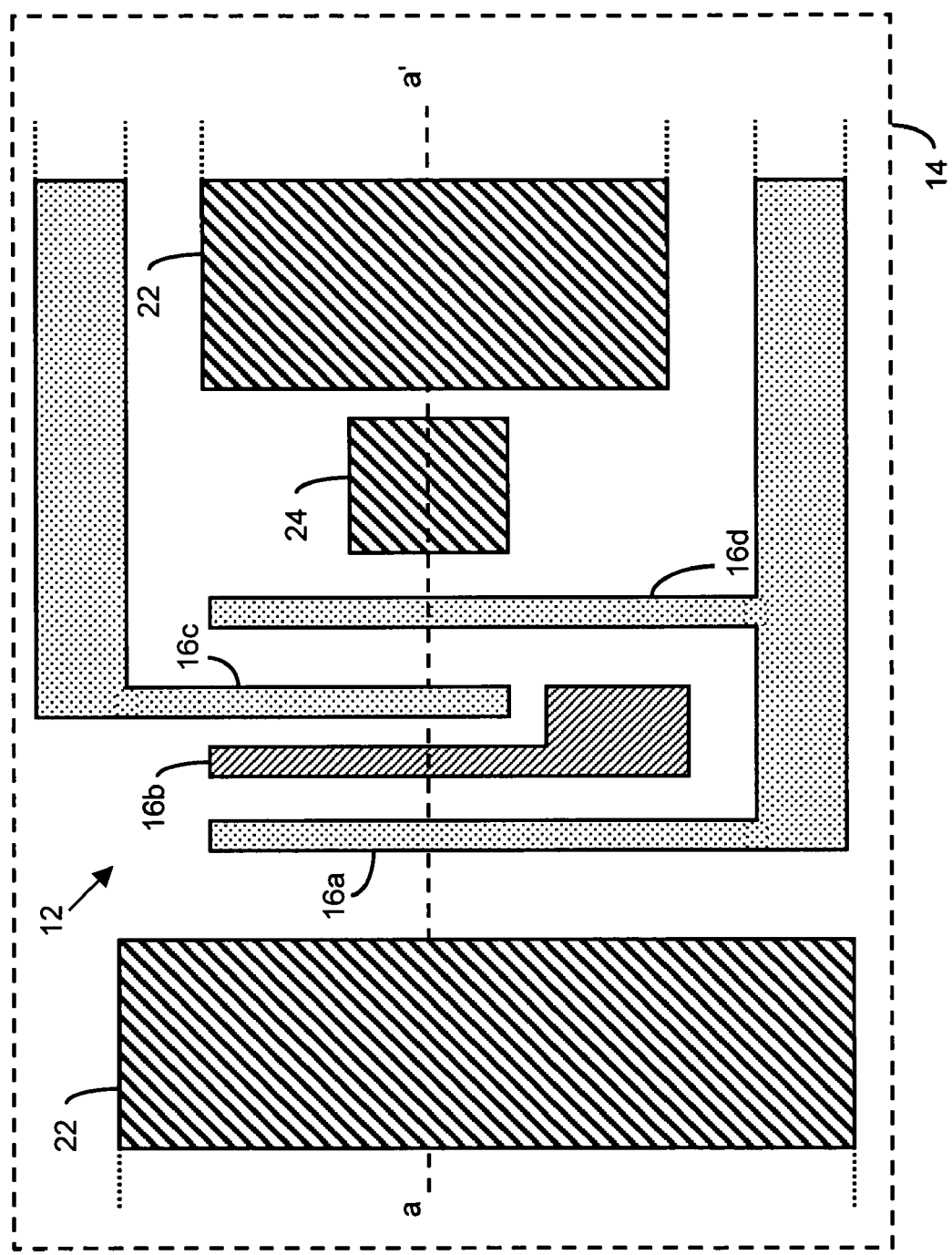
FIG. 9 illustrates a top view of a portion of another micromechanical structure, for example, a portion of an interdigitated or comb-like finger electrode array, having "moveable" electrodes and "fixed" electrodes, of an accelerometer, in conjunction with, among other things, a plurality of contact areas.

With reference to FIG. 6A, an exemplary embodiment of MEMS 10 having trap 60 may begin with an SOI substrate partially formed device including mechanical structures 16*a–d*, contact area 24, and trap 60 disposed on first sacrificial layer 36, for example, silicon dioxide or silicon nitride. The mechanical structures 16*a–d*, contact area 24 and trap 60 may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 having trap 60 may proceed in the same manner as described above with respect to FIGS. 3B–3L. In this regard, an exemplary fabrication process of MEM 10 including trap 60 is illustrated in FIGS. 6B–6L. Because the processes are substantially similar to the discussion above with respect to FIGS. 3B–3L, for the sake of brevity, that discussion will not be repeated.

As mentioned above, trap 60 of FIG. 5 is designed to prevent the material(s) that are deposited to seal, plug and/or close anti-stiction channel 32 from adversely impacting the operation of mechanical structures 16*a–d*. With reference to FIGS. 7A and 7B, in one embodiment, trap 60 is positioned and/or located to route material 62 that may leak and/or escape from anti-stiction channel 32 during deposition and/or formation of channel plug 34 away from mechanical structures 16*a–d*. In this regard, trap 60 "captures" material 62 before it enters that portion of chamber 26 where mechanical structures 16*a–d* reside. Under this circumstance, material 62 that enters chamber 26 is "prevented" from contacting and/or adversely impacting mechanical structures 16*a–d* and the operation thereof.

With reference to FIGS. 8A and 8B, in another embodiment, after fabrication of channel plug 34, diffusion barrier 64 may be deposited and/or formed over anti-stiction channel 32 and/or channel plug 34 in order to enhance the "seal" of anti-stiction channel 32 and thereby enhance the barrier to diffusion of fluid within (or external to) chamber 26 (for example, enhance the hermeticity of MEMS 10). Thus, diffusion barrier 64 alone, or in combination with channel plug 34, "traps" the fluid (having a selected, desired and/or predetermined state) in chamber 26.

The diffusion barrier 64 may be, for example, a semiconductor material (for example, a polysilicon, germanium, or silicon/germanium), an insulator material (for example, silicon dioxide, silicon nitride, BPSG, PSG, or SOG) or metal bearing material (for example, silicides). The diffusion barrier 64 may be, for example deposited, formed or grown using, for example, an epitaxial, a sputtering or a CVD-based reactor (for example, APCVD, LPCVD or PECVD). The deposition, formation and/or growth may be by a conformal process or non-conformal process. The material comprising diffusion barrier 64 may be the same as or different from channel plug 34. However, it may be advantageous to employ a low temperature deposition process (and a material that is amenable to such a deposition technique) in order to preserve and/or protect the anti-stiction barrier, layer and/or affects provided by the anti-stiction fabrication processes of the present invention.

The diffusion barrier 64 may be formed and/or deposited before formation and/or deposition of conductive layer 54, during formation and/or deposition of conductive layer 54 (see, for example, FIG. 8A), or after formation and/or deposition of conductive layer 54 (see, for example, FIG. 8B).

Notably, diffusion barrier 64 may be implemented in any of the embodiments described herein, for example, the embodiments illustrated in FIGS. 3A–3L. For the sake of brevity, that discussion will not be repeated or restated.

As mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of Microelectromechanical Systems and Method of Encapsulating Patent Application (see, for example FIGS. 9, 10A–10C, and 11A–11C). For the sake of brevity, the inventions described and illustrated in the Microelectromechanical Systems and Method of Encapsulating Patent Application, implemented in conjunction with the anti-stiction inventions described and illustrated herein, will not be repeated. It is expressly noted, however, that the entire contents of the Microelectromechanical Systems and Method of Encapsulating Patent Application, including, for example, the features, attributes, alternatives, materials, techniques and advantages of all of the embodiments and/or inventions, are incorporated by reference herein.

Figure 12:
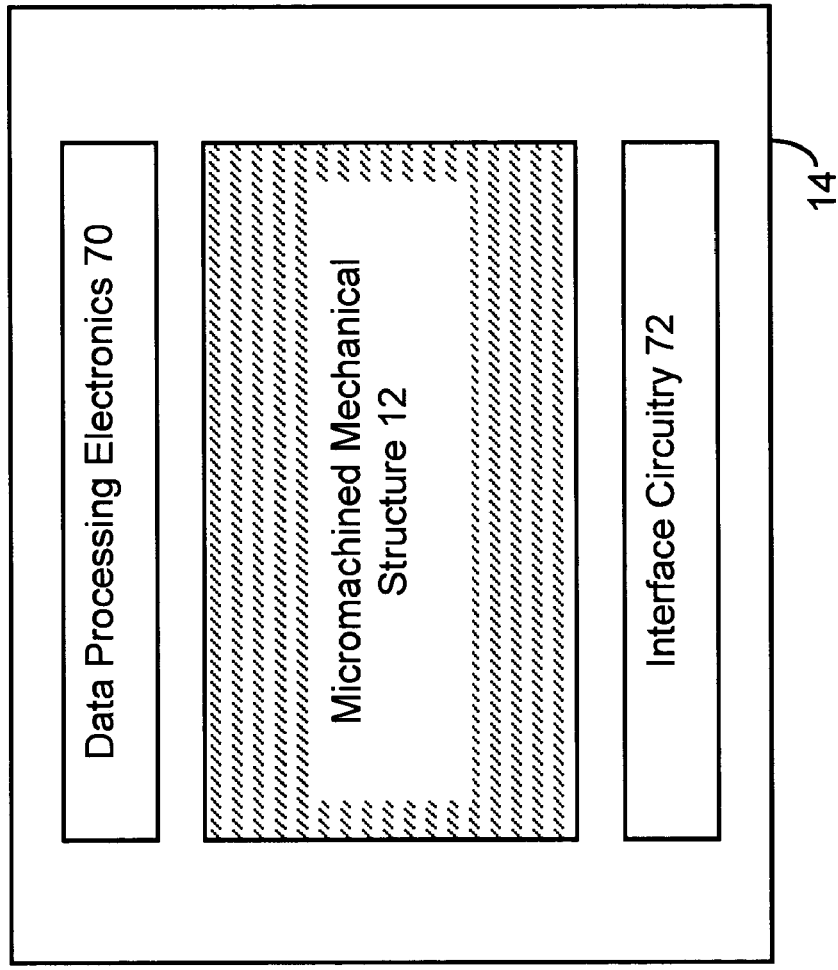
FIG. 12 is a block diagram of microelectromechanical system disposed on a substrate, in conjunction with interface circuitry and data processing electronics.

It should be noted that the present invention may be implemented in a MEMS including micromachined mechanical structure as well as data processing electronics and/or interface circuitry. With reference to FIG. 12, in one exemplary embodiment, MEMS 10 includes micromachined mechanical structure 12 that is disposed on substrate 14, for example, an undoped semiconductor-like material, a glass-like material, or an insulator-like material. The MEMS 10 may also include data processing electronics 70 to process and analyze information generated by, and/or control or monitor the operation of micromachined mechanical structure 12. In addition, MEMS 10 may also include interface circuitry 72 to provide information from micromachined mechanical structure 12 and/or data processing electronics 70 to an external device (not illustrated), for example, a computer, indicator/display and/or sensor.

The data processing electronics 70 and/or interface circuitry 72 may be integrated in or on substrate 14. In this regard, MEMS 10 may be a monolithic structure including mechanical structure 12, data processing electronics 70 and interface circuitry 72. The data processing electronics 70 and/or interface circuitry 72 may also reside on a separate, discrete substrate that, after fabrication, is bonded to or on substrate 14.

Figure 13A:
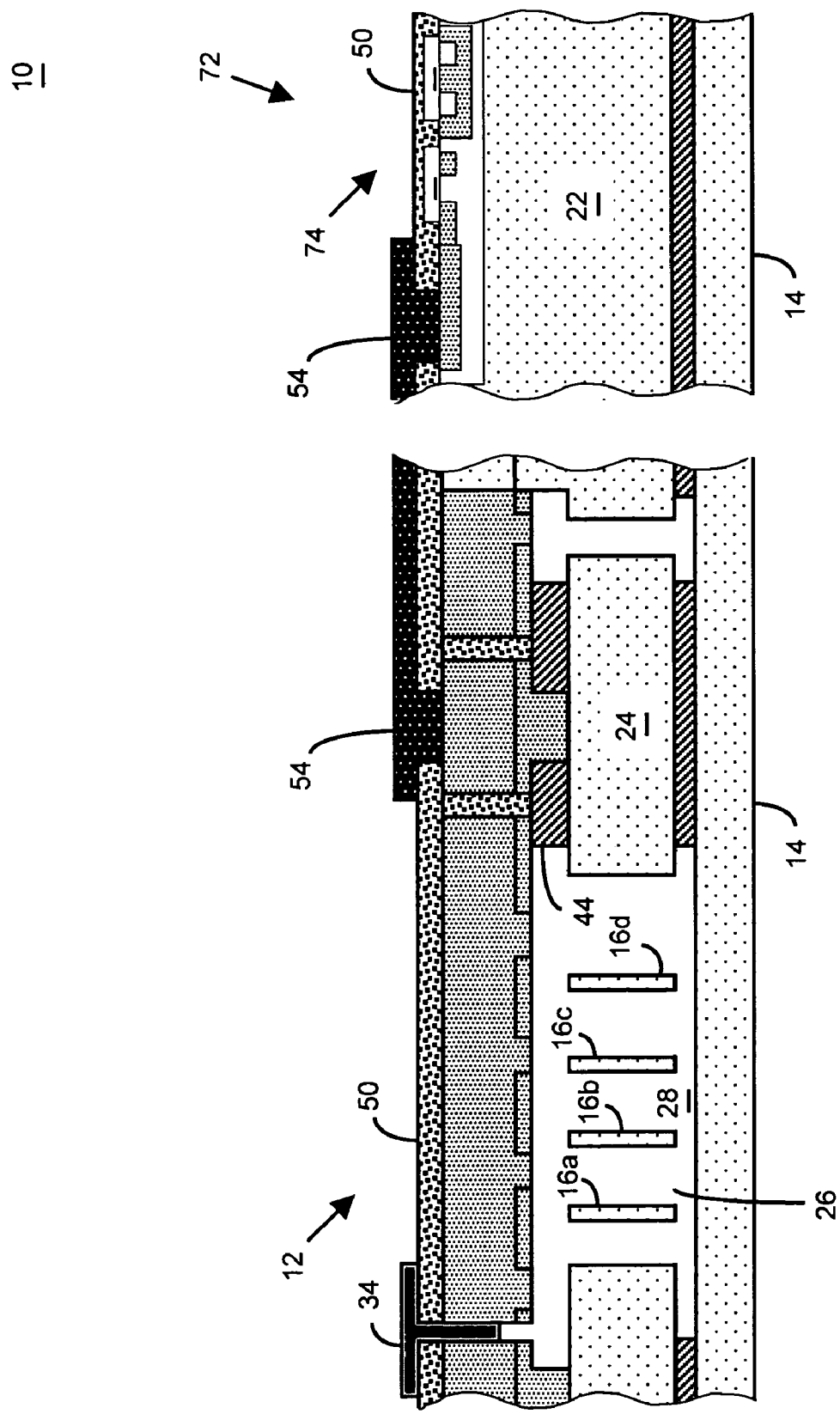
FIGS. 13A and 13B illustrate cross-sectional views of MEMS according to certain aspects of the present inventions, including a micromachined mechanical structure portion and an integrated circuit portion, both portions of which are disposed or integrated on or in a common substrate.
Figure 13B:
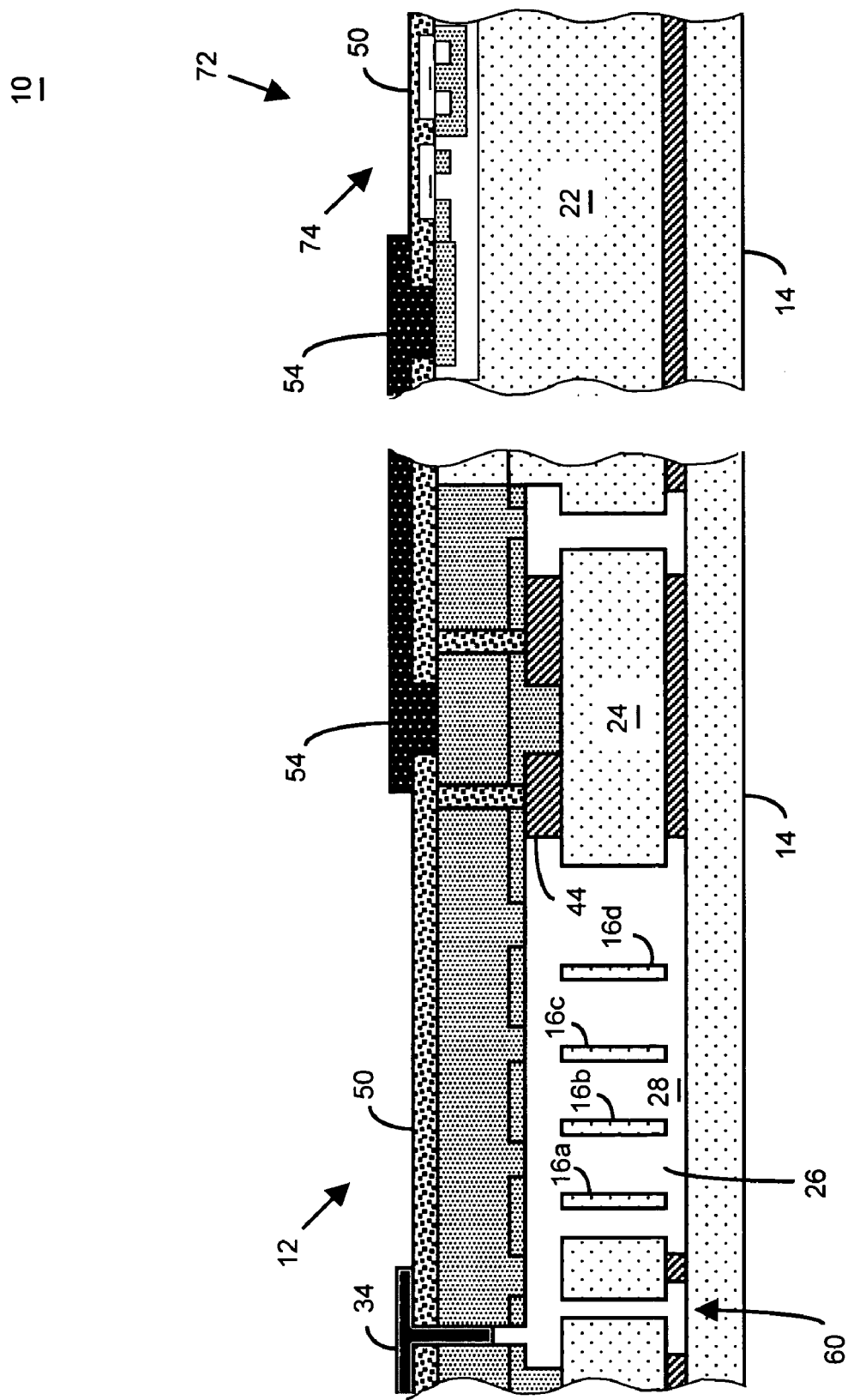
Figure 14:
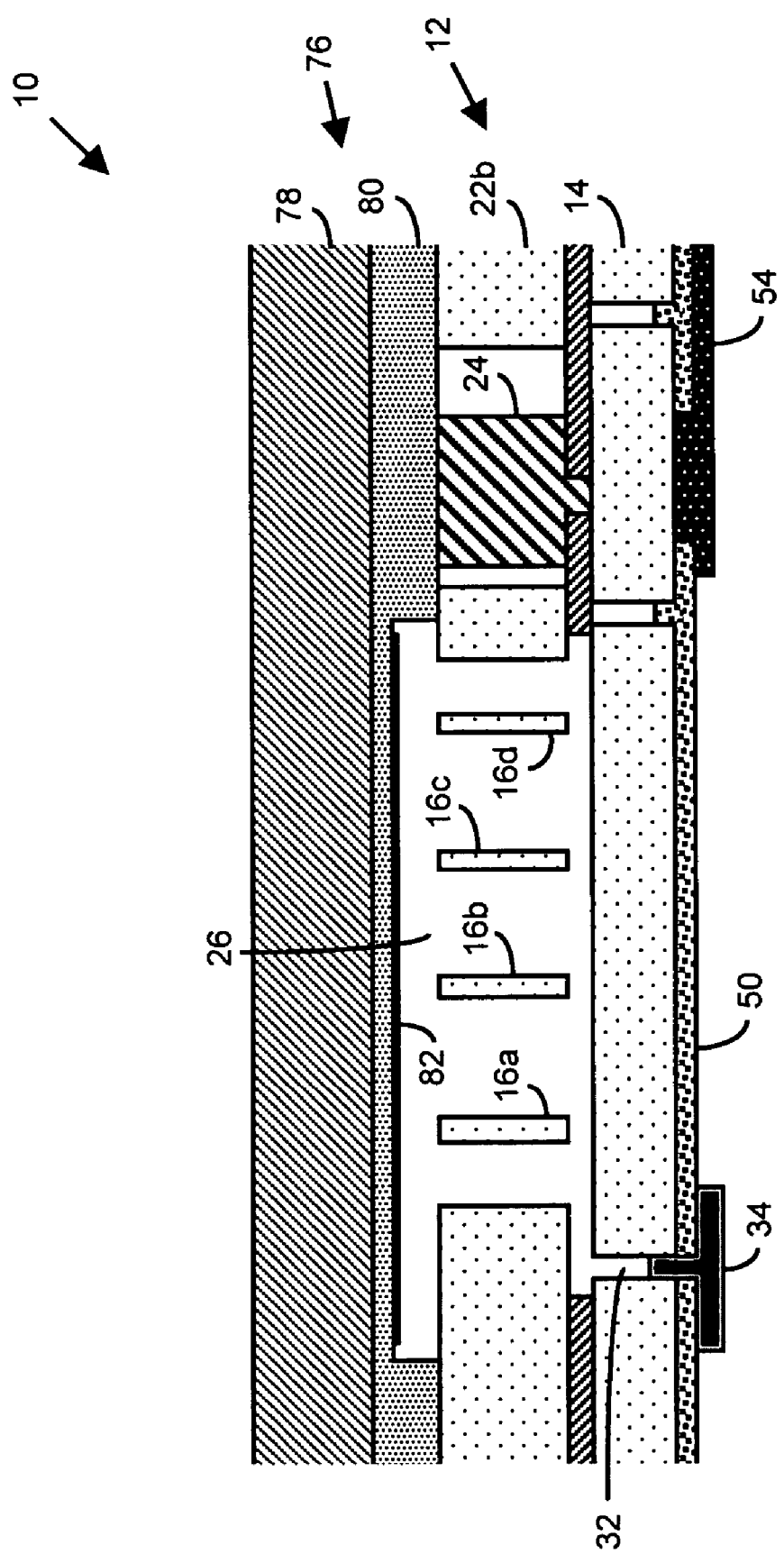
FIG. 14 illustrates a cross-sectional view (sectioned along dotted line a–a' of FIG. 1) of the portion of the interdigitated or comb-like finger electrode array and contact area of FIG. 1, in conjunction with the anti-stiction plug or cap and wafer bonded encapsulation structure, in accordance with certain aspects of the present invention.

For example, with reference to FIGS. 13A and 13B, integrated circuits 74 may be fabricated using conventional techniques after definition of mechanical structure 12 using, for example, the techniques described and illustrated in Microelectromechanical Systems and Method of Encapsulating Patent Application and/or Microelectromechanical Systems Having Trench Isolated Contacts Patent Application (see, for example, FIG. 13B). In this regard, after fabrication and encapsulation of mechanical structure 12, integrated circuits 74 may be fabricated using conventional techniques and interconnected to contact area 24 by way of conductive layer 54. In particular, as illustrated and described in Microelectromechanical Systems and Method of Encapsulating Patent Application (for example, FIGS. 12A–C thereof and/or Microelectromechanical Systems Having Trench Isolated Contacts Patent Application (for example, FIGS. 14A–E thereof, the contact area is accessed directly by integrated circuitry 74 via a low resistance electrical path (i.e., conductive layer 54) that facilitates a good electrical connection. The insulation layer 50 may be deposited, formed and/or grown and patterned and, thereafter, conductive layer 54 (for example, a heavily doped polysilicon or metal such as aluminum, chromium, gold, silver, molybdenum, platinum, palladium, tungsten, titanium, and/or copper) is formed.

With continued reference to FIGS. 13A and 13B, thereafter, the anti-stiction techniques of the present invention(s) may be implemented. That is, the anti-stiction channel window may be etched and/or formed in insulation layer 50 and anti-stiction channel 32 may be etched and/or formed in encapsulation layer(s) 30. The anti-stiction fluid may be introduced into chamber 26 via anti-stiction channel 32 thereby forming, for example, an anti-stiction layer on mechanical structures 16. Thereafter or concurrently therewith, anti-stiction channel 32 may be closed and/or sealed by channel plug 34 and/or diffusion barrier 64.

Notably, while the anti-stiction processes were described as being implemented after deposition and/or formation of insulation layer 50 and conductive layer 54, the anti-stiction processes of the MEMS 10 illustrated in FIGS. 13A and 13B may be performed in another order. That is, contact opening 52 and anti-stiction channel window 56 may be fabricated either consecutively or simultaneously. Moreover, the anti-stiction fabrication/processes may be performed after deposition of conductive layer 54 or before fabrication of deposition of conductive layer 54. In addition, channel plug 34 may be formed and/or deposited simultaneously with the formation and/or deposition of conductive layer 54.

In another aspect, the present invention employs waferbonding encapsulation techniques, in conjunction with the anti-stiction techniques described above. In this regard, with reference to FIG. 14, in one embodiment, MEMS 10 includes micromachined mechanical structure 12 and wafer bonded encapsulation structure 76. The micromachined mechanical structure 12 may be fabricated using any of the techniques described and illustrated herein or using conventional techniques.

The wafer bonded encapsulation structure 76 may be bonded and/or "attached", using, for example, anodic bonding. In one embodiment, wafer bonded encapsulation structure 76 includes cap wafer 78 (for example, silicon), insulation layer 80 (for example, SOG or Pyrex) and anodic shield 82 (for example, a metal). Notably, wafer bonded encapsulation structure 76 may be bonded and/or "attached" using conventional techniques.

In one embodiment, the anti-stiction techniques described and illustrated above are "applied" to the exposed surface of substrate 14. In this regard, anti-stiction channel 32 is formed in substrate 14 and, thereafter an anti-stiction fluid is introduced into chamber 26, as described above. The anti-stiction plug 34 is then deposited and/or formed to "re-seal" chamber 26.

Figure 15A:
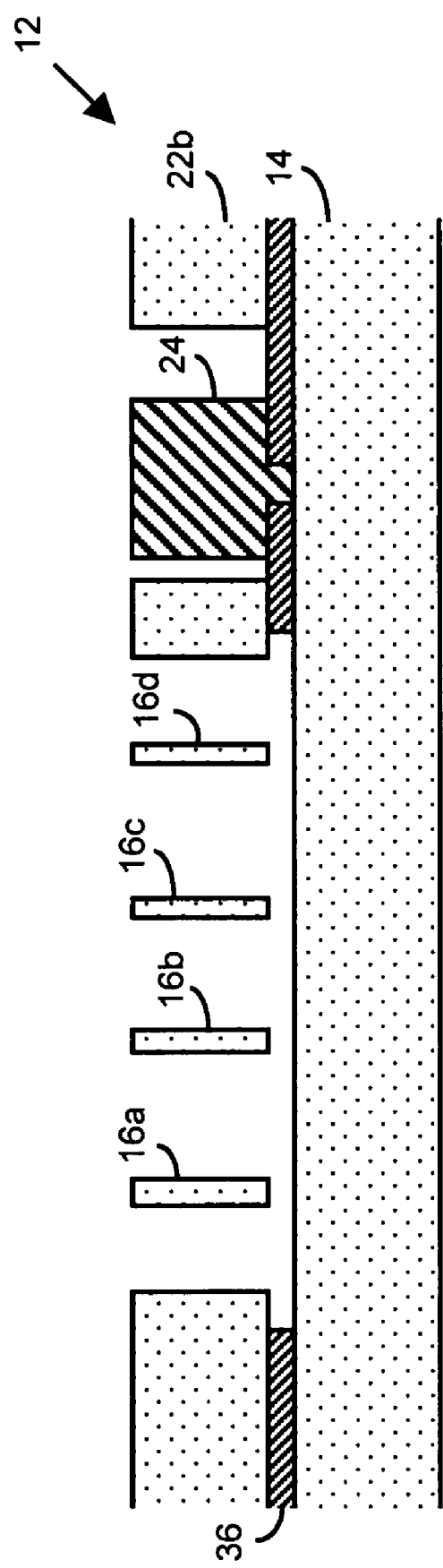
FIGS. 15A–15F illustrate cross-sectional views of the fabrication of the MEMS, including anti-stiction plug or cap, of FIG. 14 at various stages of the process, according to certain aspects of the present invention.

For example, with reference to FIG. 15A, MEMS 10 may begin with an SOI substrate partially formed device including "released" mechanical structures 16a–d and contact area 24 partially disposed on first sacrificial layer 36, for example, silicon dioxide or silicon nitride. The fabrication and/or formation of the structures of micromachined mechanical structure 12 may be accomplished using the techniques described and illustrated herein or any conventional technique. Indeed, all techniques and materials used to fabricate and/or form mechanical structure 12, whether now known or later developed, are intended to be within the scope of the present invention.

Figure 15B:
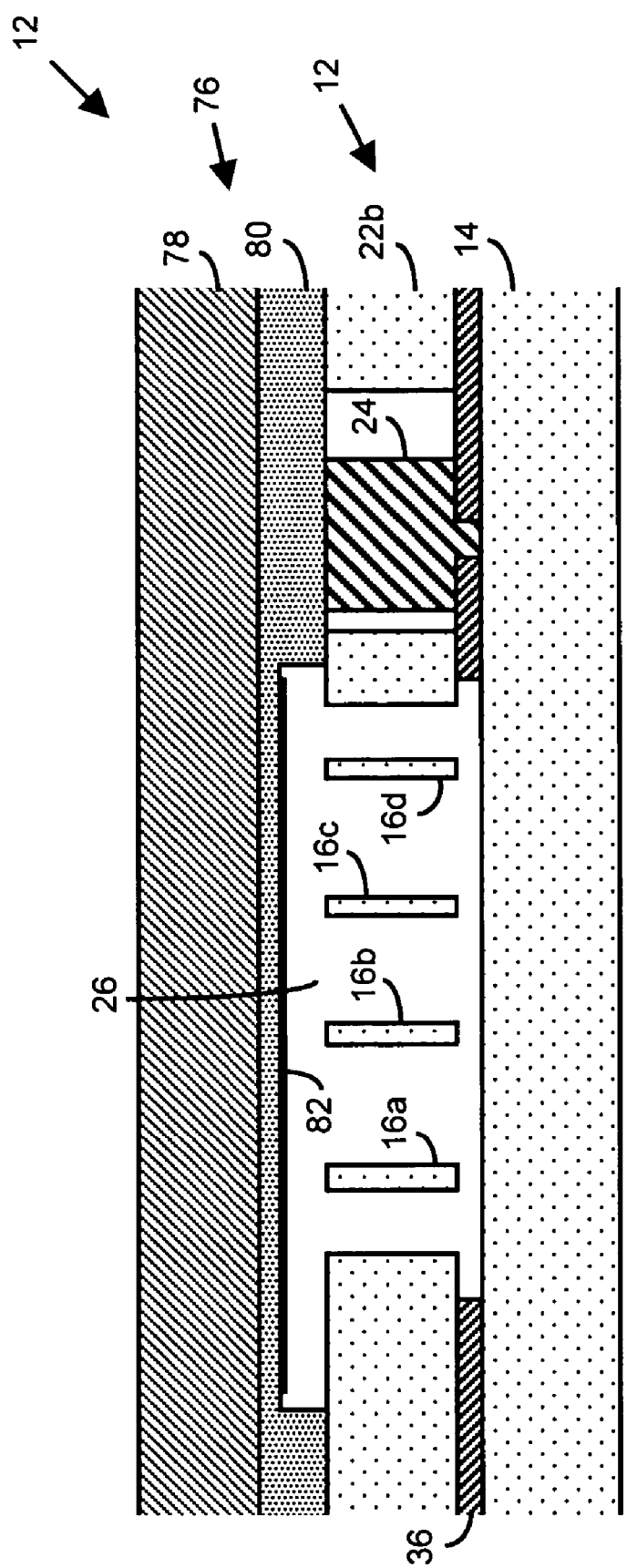

With reference to FIG. 15B, thereafter, wafer bonded encapsulation structure 76 may be "applied" and/or bonded to micromachined mechanical structure 12. For example, in one embodiment, wafer bonded encapsulation structure 76 is bonded using anodic techniques. Notably, wafer bonded encapsulation structure 76 may be "bonded" to micromachined mechanical structure 12 using conventional techniques. In addition, all techniques and materials used to fabricate and/or form wafer bonded encapsulation structure 76, whether now known or later developed, are intended to be within the scope of the present invention.

Figure 15C:
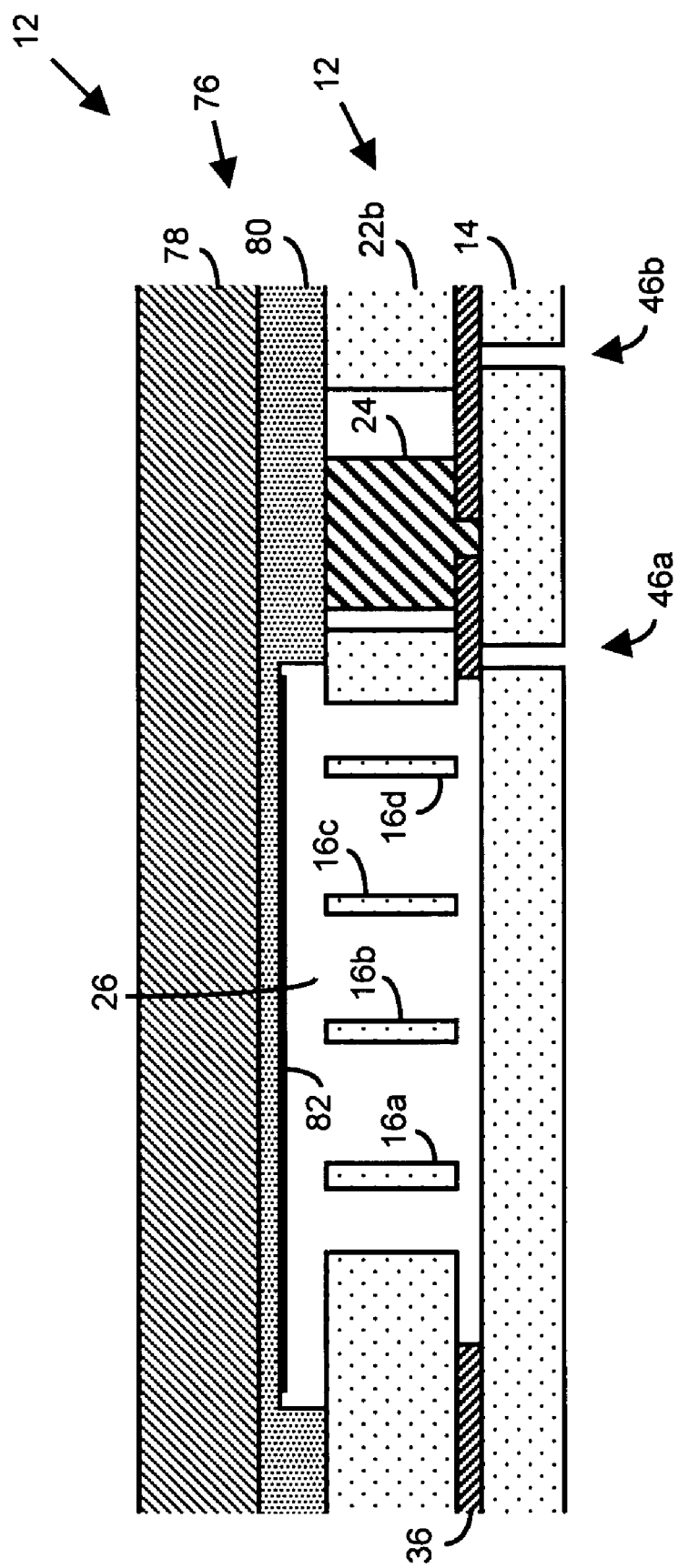
Figure 15D:
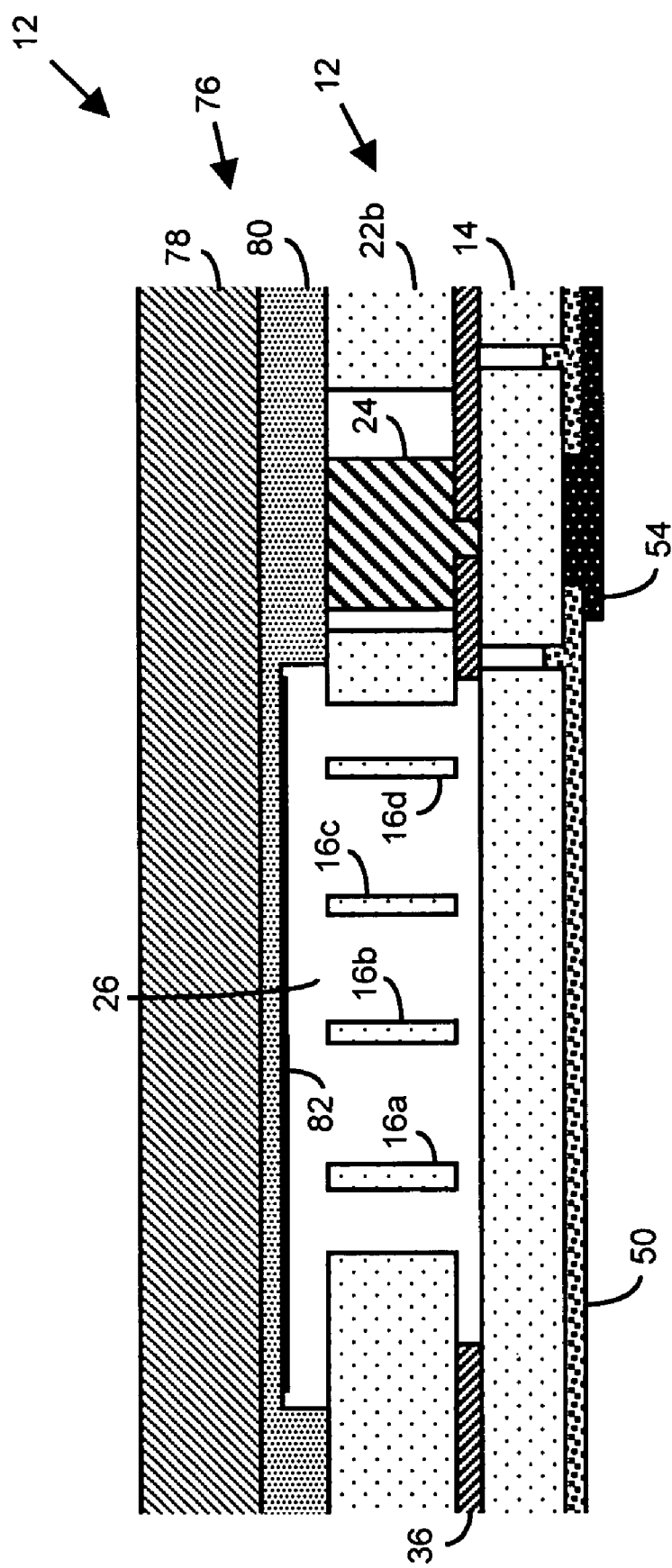

With reference to FIGS. 15C and 15D, substrate 14 may be thinned (for example, to a thickness of between 20 μm to 200 μm, to facilitate contact or interconnection to contact area 24. In this regard, contact area 24 may be isolated via trenches 46a and 46b using an anisotropic etching technique (see, FIG. 15C) as described in detail above. Thereafter, an electrical path may be deposited and/or formed to interconnect contact area 24 with, for example, integrated or external electronics and/or circuitry. In this regard, conductive layer 54 may be deposited and/or formed after deposition of insulation layer 50. (See, FIG. 15D)

Figure 15E:
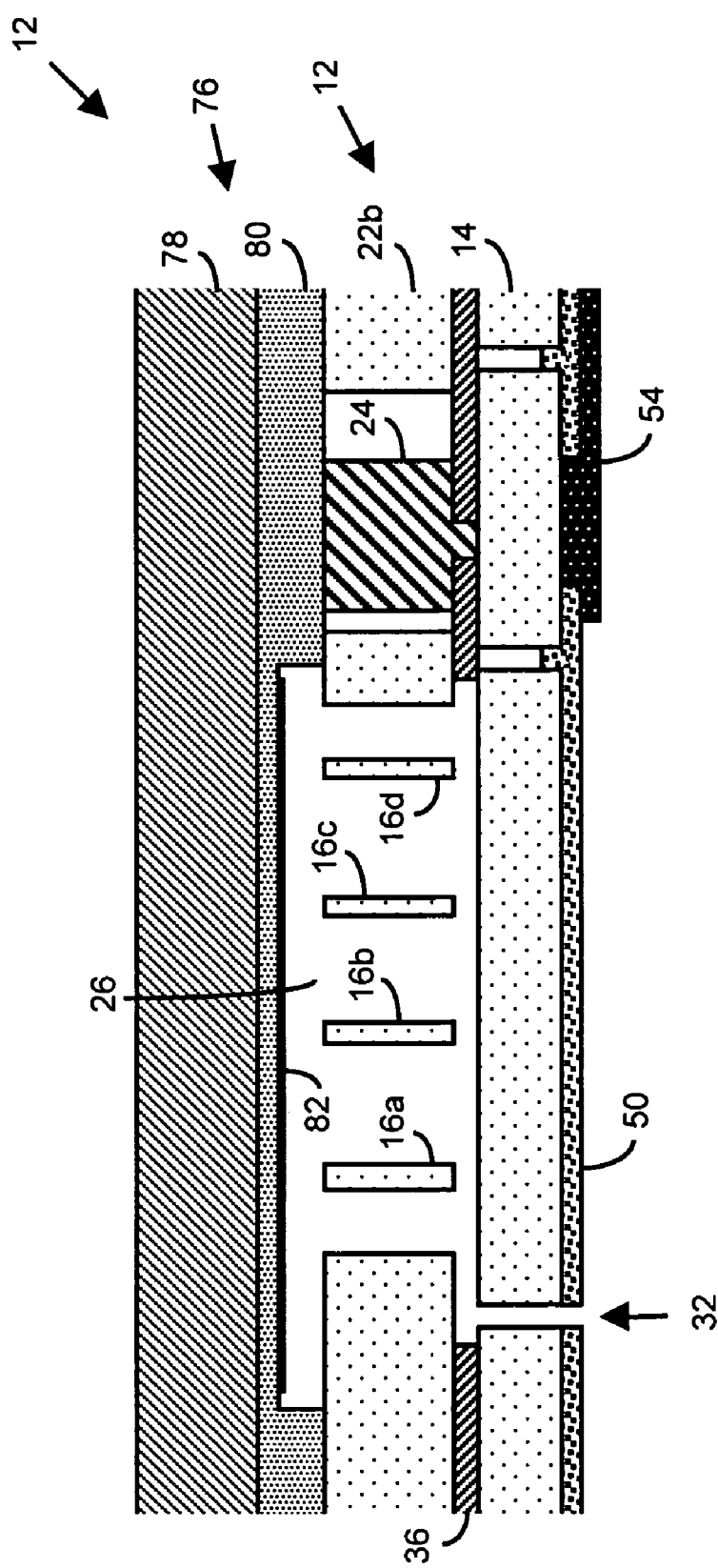
Figure 15F:
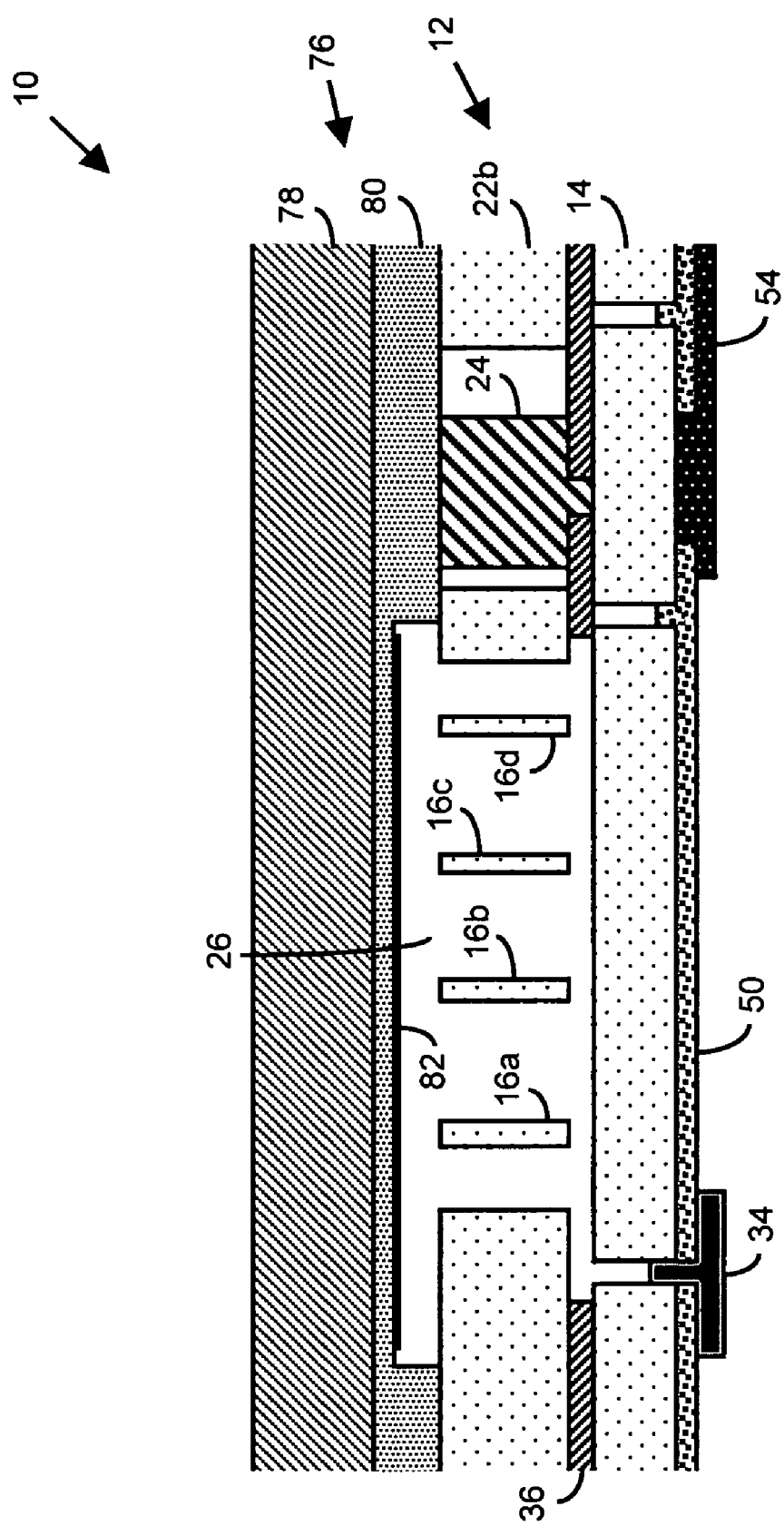
Figure 17A:
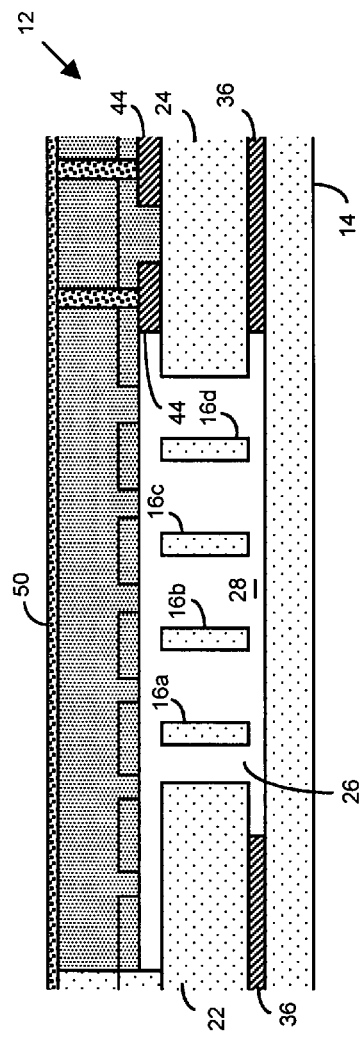
Figure 17B:
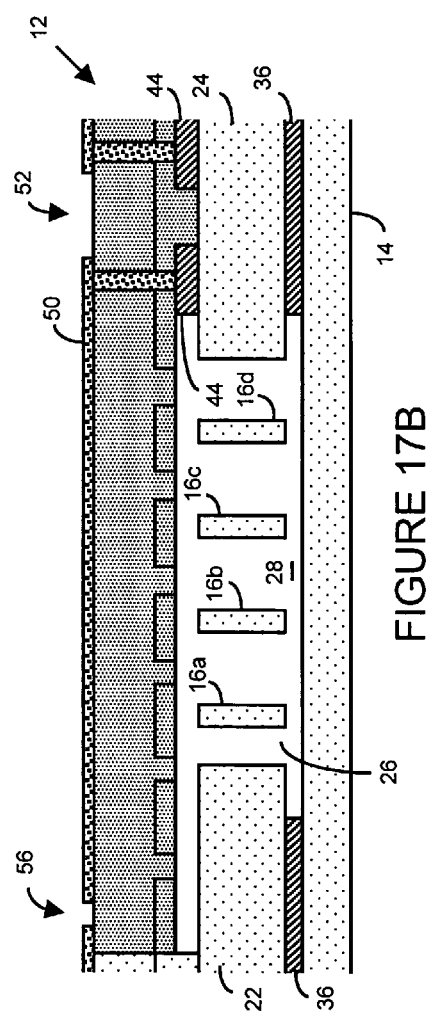
Figure 17E:
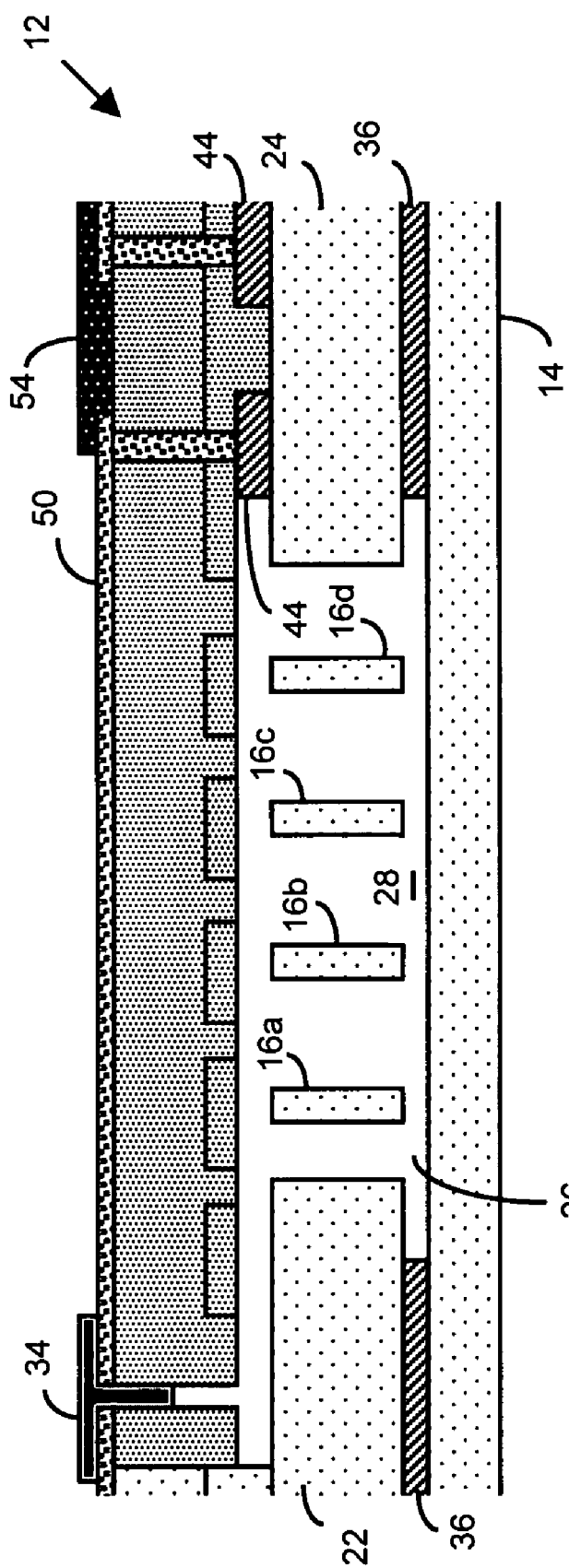

With reference to FIGS. 15E and 15F, anti-stiction channel 32 may be formed (see, FIG. 15E), and an anti-stiction fluid may be introduced into chamber 26. The techniques described and illustrated above may be applied here. After (or concurrently with) introduction of the anti-stiction fluid, channel plug 34 may be deposited and/or formed to "seal" anti-stiction channel 32. As mentioned above, channel plug 34 may be a spin-on polymer, SOG, metal material. Moreover, channel plug 34 may be formed using/from silk screening of or dispensed seal-glass, plastic and/or epoxy. Indeed, any material (and corresponding fabrication technique) may be implemented that, in one embodiment, provides a barrier to maintain a suitable environment in chamber 26 and is formed, applied and/or grown using parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction characteristics.

Notably, as described above, a diffusion barrier may be incorporated to enhance the "seal" of chamber 26. The diffusion barrier alone, or in combination with channel plug 34, "traps" the fluid (having a selected, desired and/or predetermined state) in chamber 26. Thus, after sealing and/or closing anti-stiction channel 32, mechanical structures 16a–d retain suitable anti-stiction characteristics and/or properties.

It should be further noted that all of the anti-stiction techniques described and illustrated in connection with the thin film wafer fabrication (for example, FIGS. 2, 5, 8A and 8B) may be applied to the wafer bonded encapsulation embodiment. For the sake of brevity, those discussions will not be repeated.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 20A:
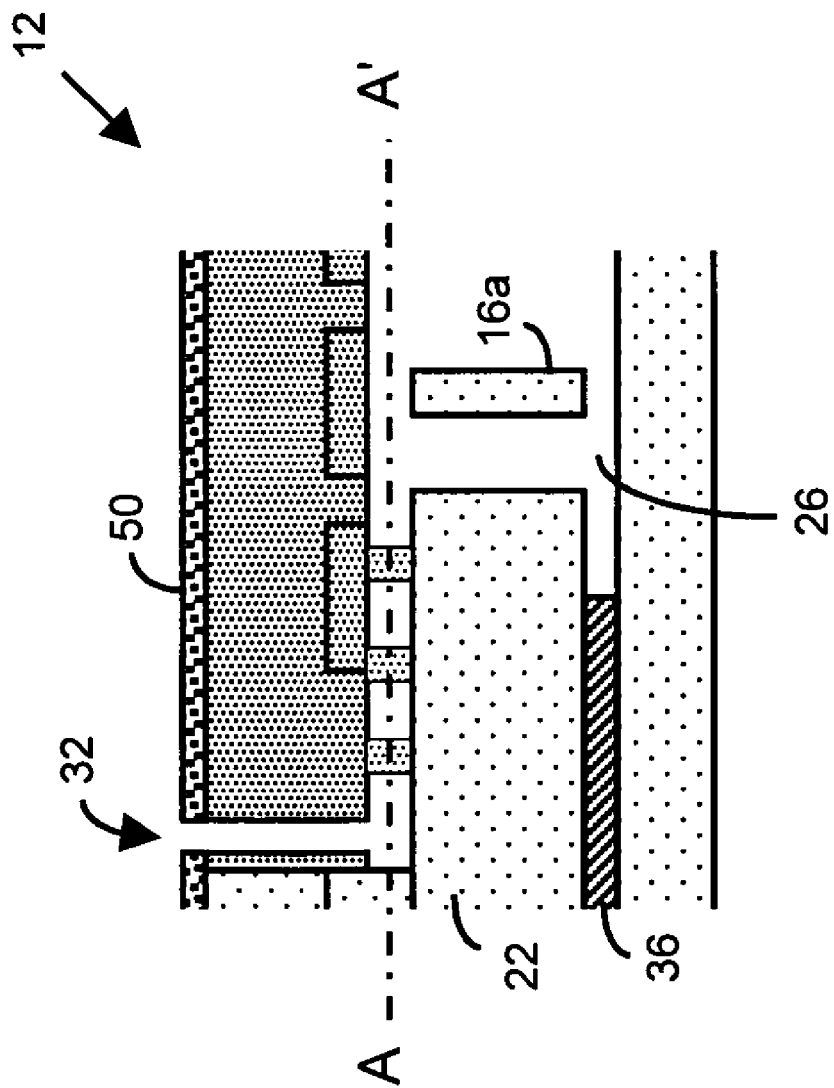
FIG. 20A is a partial cross-sectional view (sectioned along dotted line a–a' of FIG. 1) of the portion of the interdigitated or comb-like finger electrode array, in conjunction with a substantially horizontal trap, in accordance with certain aspects of the present invention.
Figure 20B:
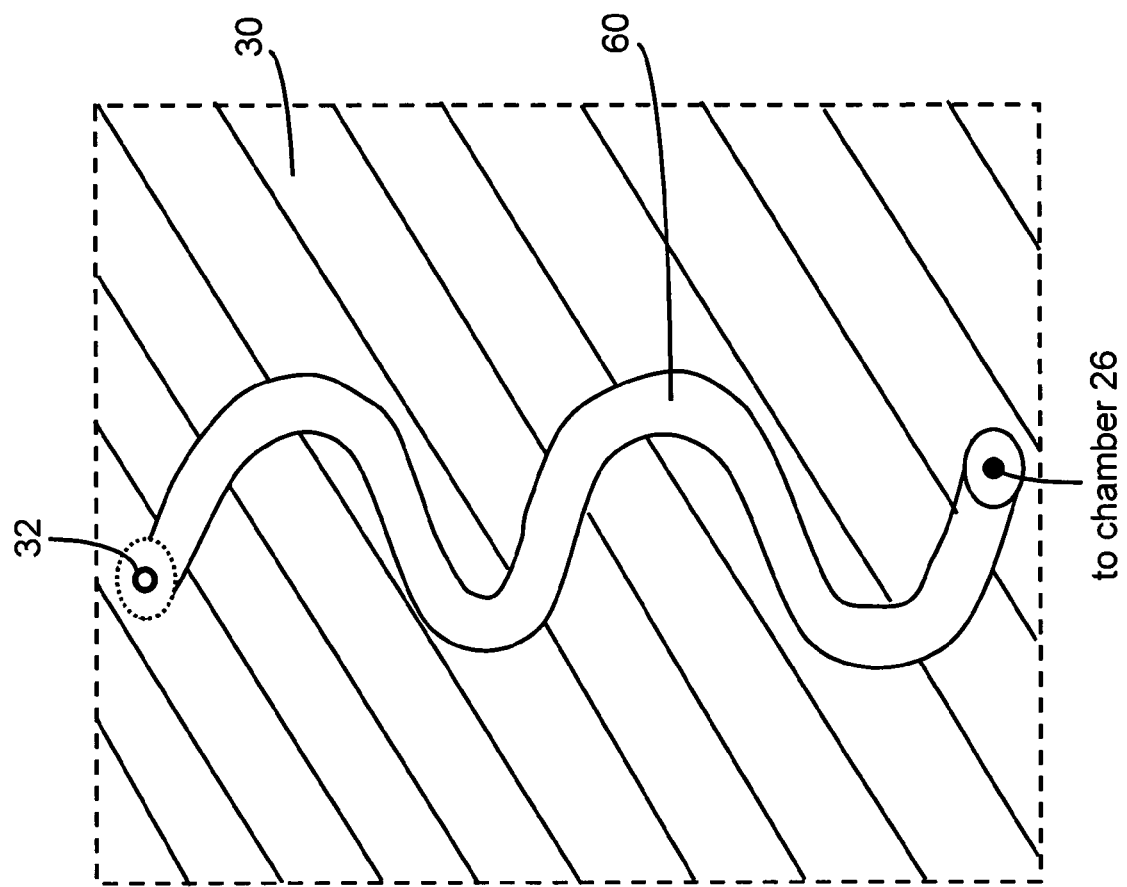
FIG. 20B is a (lateral) cross-sectional view (sectioned along dotted line A–A') of FIG. 20A illustrating the serpentine shape of the substantially horizontal trap.

For example, while the exemplary embodiments and/or processes of the invention have been described above according to a particular order, that order should not be interpreted as limiting. For example, contact opening 52 and anti-stiction channel window 56 may be fabricated either consecutively (see, for example, FIG. 3I–3K and FIGS. 16B–16E) or simultaneously (see, for example, FIG. 20B). Moreover, the anti-stiction fabrication/processes may be performed after deposition of conductive layer 54 (see, for example, FIGS. 3J–3L) or before fabrication of deposition of conductive layer 54 (see, for example, FIGS. 17A–17F).

Indeed, anti-stiction channel 32 may be comprised of a plurality of channels etched in substrate 14, encapsulation layer(s) 30 and/or wafer bonded encapsulation structure 76. The channels may be located at selected sites to more efficiently, fully and/or evenly provide the anti-stiction fluid within chamber and thereby more efficiently, fully and/or evenly/conformally provide an anti-stiction layer (for example, a monolayer coating or self-assembled monolayer) on micromachined mechanical structure 12. In this regard, the anti-stiction channels 32 may be, for example, evenly situated or placed around substrate 14, encapsulation layer(s) 30 and/or wafer bonded encapsulation structure 76, or distributed according to the relative concentration of structures 16 (for example, more channels 32 concentrated in regions or areas of dense mechanical structures and/or less channels 32 concentrated in regions or areas of less "populated" by mechanical structures).

In addition, it may be advantageous to locate the anti-stiction channels 32 in accordance with regions or areas where the mechanical structures are more likely to contact other structures or elements of micromachined mechanical structure 12 and/or are more susceptible to the debilitating effects of stiction. In this way, the anti-stiction fluid is more likely to efficiently, fully and/or evenly/conformally provide an anti-stiction layer (for example, a monolayer coating or self-assembled monolayer) on such mechanical structures of micromachined mechanical structure 12.

Figure 18:
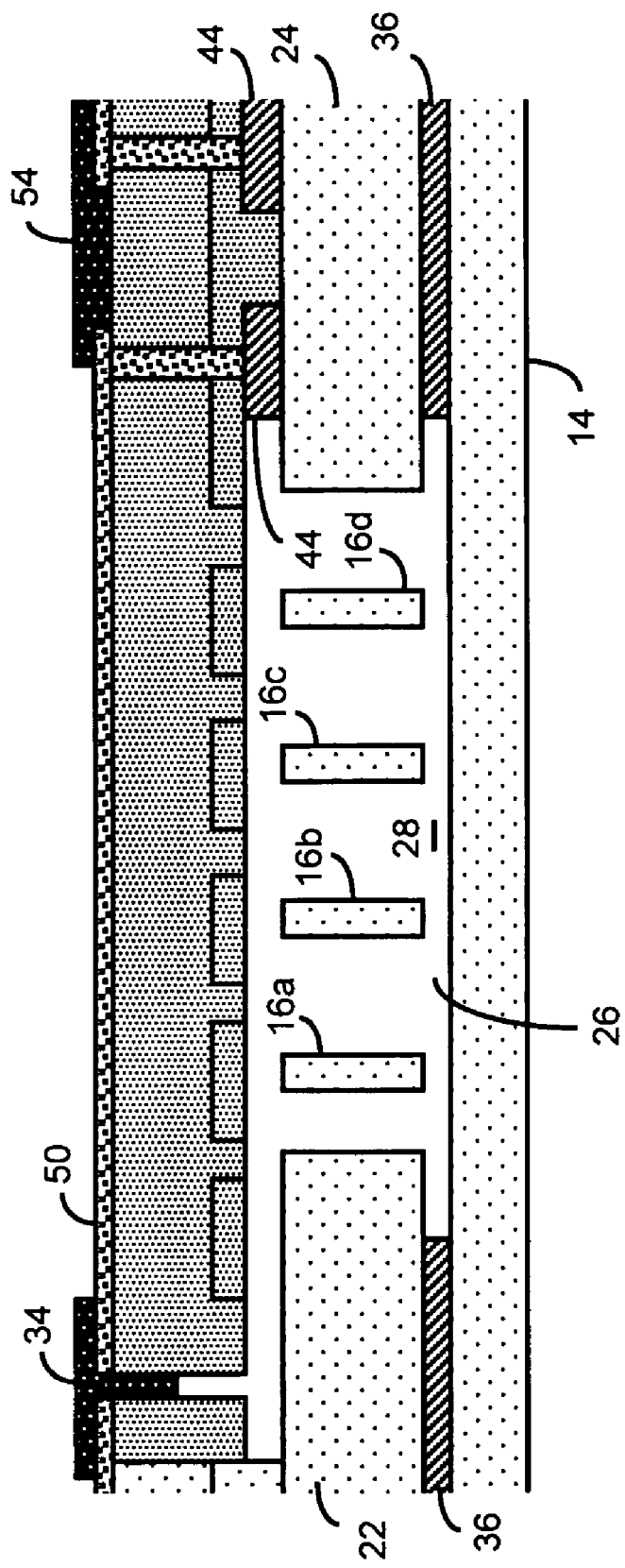
FIG. 18 illustrates a cross-sectional view of the interdigitated or comb-like finger electrode array, contact area and a trench isolated contact, in conjunction with an anti-stiction plug or cap that is comprised of the same material as the conductive layer disposed above and in contact with the contact area, in accordance with another aspect of the present invention.

Further, channel plug 34 may be formed and/or deposited simultaneously with the formation and/or deposition of conductive layer 54. In this embodiment, channel plug 34 may be a metal or highly doped semiconductor material (for example, highly doped polysilicon). (See, for example, FIG. 18). In those instances where channel plug 34 is comprised of a metal, it may be advantageous to employ trap 60 to "protect" micromachined mechanical structure 12 in the event that the metal material enters chamber 26 (see, for example, FIGS. 19A and 19B).

Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, FIGS. 20A and 20B).

Figure 21A:
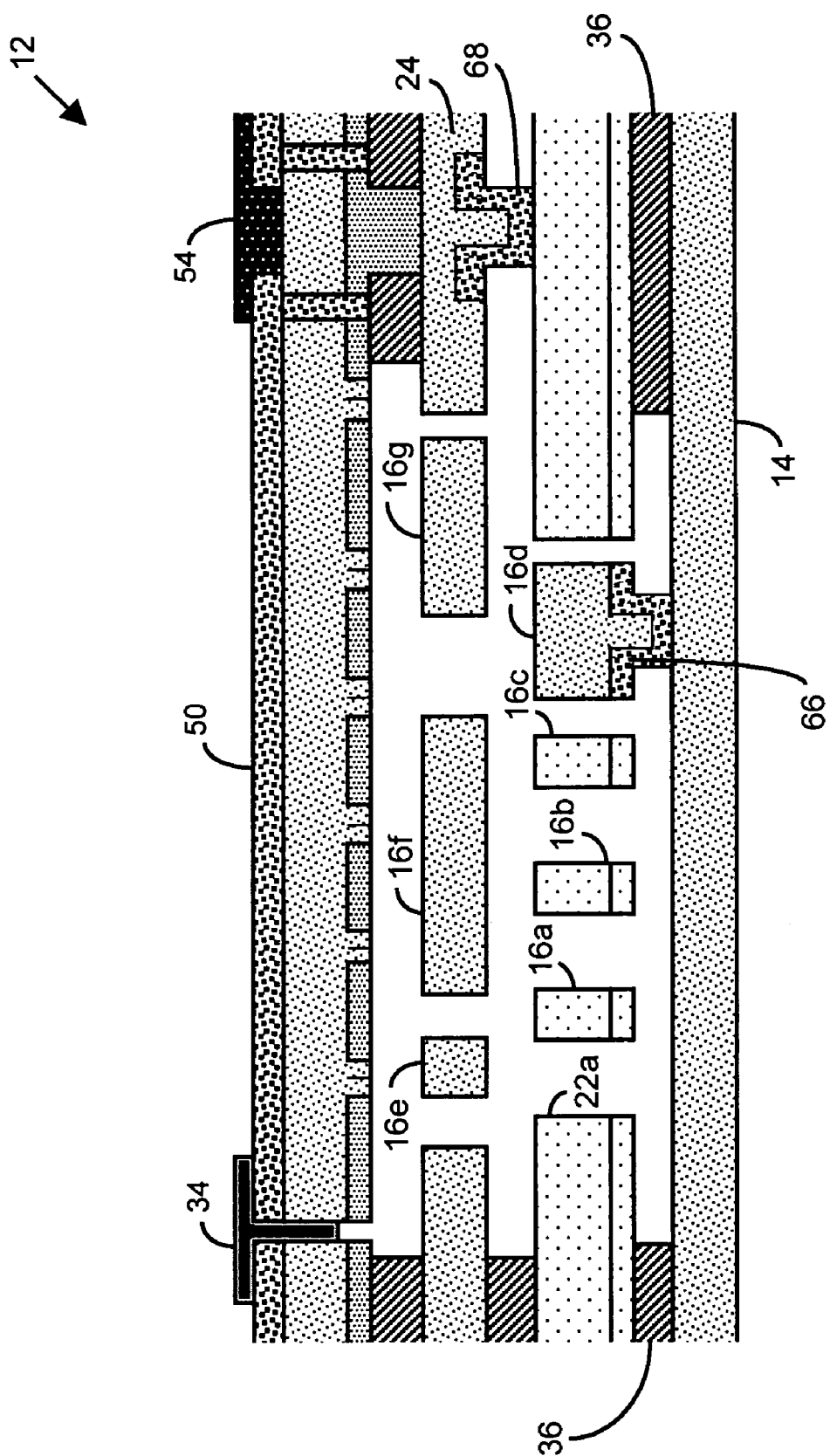
FIGS. 21A and 21B illustrate cross-sectional views of a micromechanical structure, having a plurality of microstructures and a contact, which are monolithically integrated on or within the substrate of a MEMS, in accordance with certain aspect of the present invention.
Figure 21B:
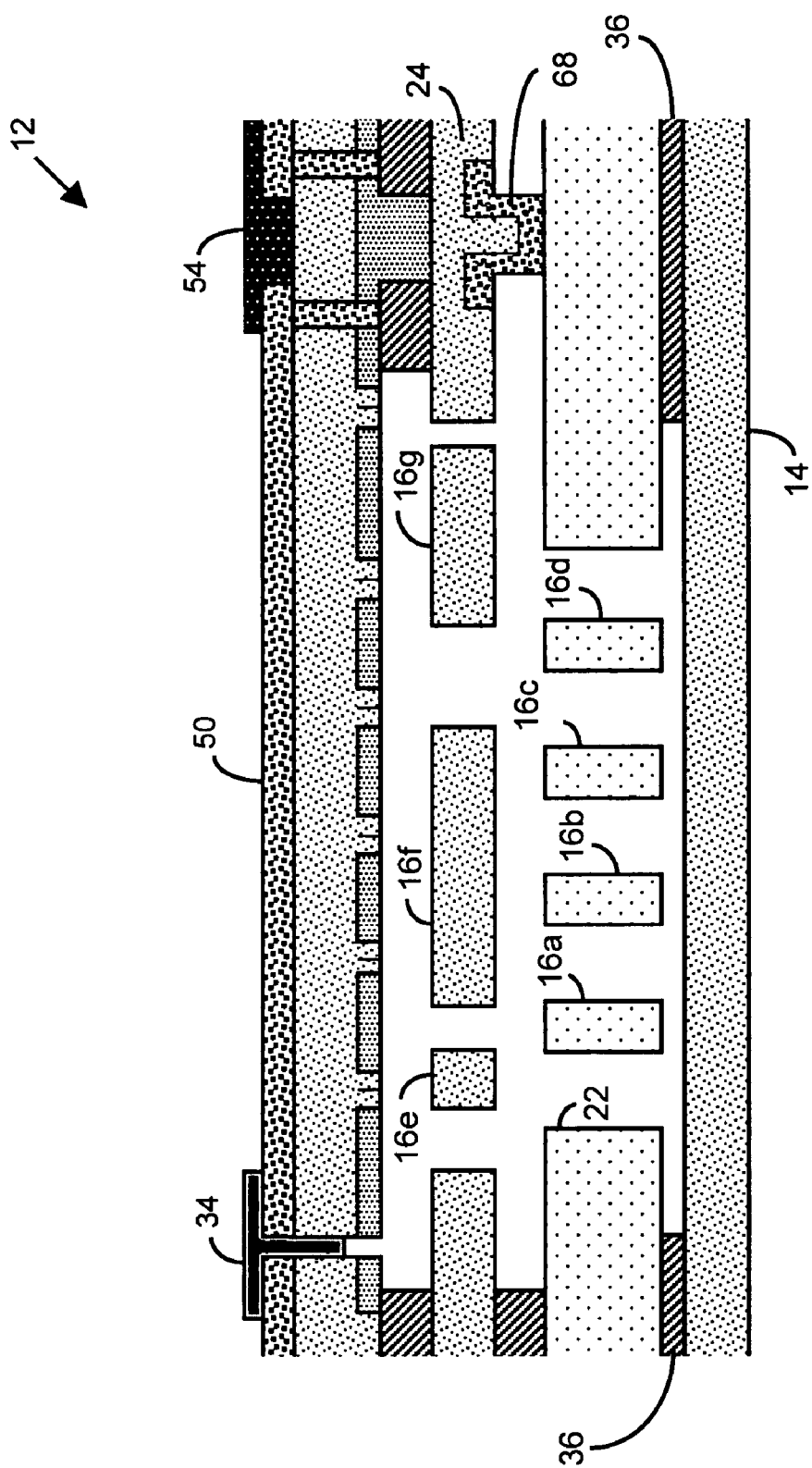

In addition, as mentioned above, the anti-stiction techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application and/or Microelectromechanical Systems Having Trench Isolated Contacts Patent Application. Accordingly, any and all of the anti-stiction inventions and/or embodiments illustrated and described herein may be implemented in the embodiments of Microelectromechanical Systems and Method of Encapsulating Patent Application and/or Microelectromechanical Systems Having Trench Isolated Contacts Patent Application that include multiple layers of mechanical structures, contacts areas and buried contacts that are vertically and/or laterally stacked or interconnected (see, for example, micromachined mechanical structure 12 of FIGS. 11B, 11C and 11D of Microelectromechanical Systems and Method of Encapsulating Patent Application and/or micromachined mechanical structure 12 of FIGS. 13B, 13C and 13D of Microelectromechanical Systems Having Trench Isolated Contacts Patent Application). Under this circumstance, the MEMS may be fabricated using the anti-stiction techniques described in this application wherein the mechanical structures include one or more processing steps to provide the vertically and/or laterally stacked and/or interconnected multiple layers (see, for example, FIGS. 21A and 21B).

Thus, any of the techniques, materials and/or embodiments of fabricating and/or encapsulating micromachined mechanical structure 12 that are described in the Microelectromechanical Systems and Method of Encapsulating Patent Application and/or in the Microelectromechanical Systems Having Trench Isolated Contacts Patent Application may be employed with the embodiments and/or the inventions described herein.

Moreover, the present invention may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, with reference to FIGS. 19A and 19B, in one embodiment, anchors 66 and/or 68 may be comprised of a material that is relatively unaffected by the release processes of the mechanical structures. In this regard, the etch release process are selective or preferential to the material(s) securing mechanical structures 16 in relation to the material comprising anchors 66. Moreover, anchors 66 and/or 68 may be secured to substrate 14 in such a manner that removal of insulation layer 50 has little to no affect on the anchoring of mechanical structures 16 to substrate 14.

It should be noted that the embodiments described herein may be incorporated into MEMS 10 described and illustrated in Anchors for Microelectromechanical Systems Patent Application. For the sake of brevity, the inventions and/or embodiments described and illustrated in the Anchors for Microelectromechanical Systems Patent Application, implemented in conjunction with the anti-stiction inventions described and illustrated herein, will not be repeated. It is expressly noted, however, that the entire contents of the Anchors for Microelectromechanical Systems Patent Application, including, for example, the features, attributes, alternatives, materials, techniques and advantages of all of the embodiments and/or inventions, are incorporated by reference herein.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)).

Further, in the claims, the term "contact" means a conductive region, partially or wholly disposed outside the chamber, for example, the contact area and/or contact via.

It should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics. Indeed, any MEMS structure that is encapsulated by using thin film packaging or wafer bonding techniques, and subsequently "opened", and, after application or introduction of an anti-stiction fluid, is "re-sealed" is to be within the scope of the present invention.

Finally, as mentioned above, all of the embodiments of the present invention described and illustrated herein may be implemented in the embodiments of Microelectromechanical Systems and Method of Encapsulating Patent Application and/or Microelectromechanical Systems Having Trench Isolated Contacts Patent Application and/or Anchors for Microelectromechanical Systems Patent Application. For the sake of brevity, those permutations and combinations will not be repeated but are incorporated by reference herein.

What is claimed is:

1. A method of manufacturing an electromechanical device having a mechanical structure that is disposed in a sealed chamber which is formed, at least in part, by an encapsulation layer, the method comprising:
   forming at least one anti-stiction channel through the encapsulation layer;
   introducing an anti-stiction fluid into the chamber via the anti-stiction channel wherein the anti-stiction fluid forms a monolayer or self-assembled layer on at least a portion of the mechanical structure; and
   depositing an anti-stiction plug over or in the anti-stiction channel to re-seal the chamber.

2. The method of claim 1 wherein the anti-stiction fluid includes DDMS, OTS, PFOTCS, PFDA, FDTS, PFPE or FOTS.

3. The method of claim 1 wherein the at least one anti-stiction channel is formed through the encapsulation layer using anisotropic etching.

4. The method of claim 3 wherein the at least one anti-stiction channel is formed through the encapsulation layer using reactive ion etching.

5. The method of claim 1 wherein the anti-stiction plug includes spin-on polymer, SOG or a metal material.

6. The method of claim 1 wherein the anti-stiction plug includes spin-on polymer or SOG which is deposited using silk screening.

7. The method of claim 1 wherein the anti-stiction plug includes spin-on polymer or SOG which is deposited using dispensed seal-glass, plastic or epoxy.

8. The method of claim 1 wherein the electromechanical device further includes a contact area and wherein the method further includes:
   forming a trench around the contact area wherein the contact area is at least partially disposed outside the chamber; and
   depositing a first insulating material in the trench to electrically isolate the contact area.

9. The method of claim 8 further including:
   depositing a second insulating layer over at least a portion of the trench; and
   depositing a highly conductive material on the contact and over the second insulating layer to provide electrical connection to the contact area.

10. The method of claim 8 further including:
    depositing a second insulating layer over at least a portion of the trench; and
    forming an anti-stiction window in the second insulating layer before forming the at least one anti-stiction channel through the encapsulation layer.

11. The method of claim 10 further including depositing a highly conductive material on the contact area and over the second insulating layer to provide electrical connection to the contact area wherein at least a portion of the anti-stiction plug includes the highly conductive material.

12. The method of claim 10 further including depositing a diffusion barrier on the anti-stiction plug.

13. The method of claim 12 wherein the diffusion barrier includes a polysilicon, germanium, silicon/germanium, silicon dioxide, silicon nitride, BPSG, PSG, SOG or metal bearing material.

14. The method of claim 10 further including depositing a highly conductive material on the contact area and over the second insulating layer and anti-stiction plug wherein the highly conductive material provides a barrier to diffusion for the chamber and electrical interconnection for the contact area.

15. The method of claim 8 wherein the trench is formed simultaneously with the forming of the at least one anti-stiction channel through the encapsulation layer.

16. A method of manufacturing an electromechanical device having a mechanical structure which is disposed over a substrate and in a sealed chamber which is formed, at least in part, by an encapsulation structure, the method comprising:
    forming at least one anti-stiction channel through the encapsulation structure or the substrate;
    introducing an anti-stiction fluid into the chamber via the at least one anti-stiction channel wherein the anti-stiction fluid forms an anti-stiction layer on at least a portion of the mechanical structure; and
    depositing an anti-stiction plug over or in the anti-stiction channel to re-seal the chamber.

17. The method of claim 16 wherein the anti-stiction fluid includes DDMS, OTS, PFOTCS, PFDA, FDTS, PFPE or FOTS.

18. The method of claim 16 wherein the at least one anti-stiction channel is formed through the encapsulation structure or the substrate using anisotropic etching.

19. The method of claim 18 wherein the at least one anti-stiction channel is formed through the encapsulation structure or the substrate using reactive ion etching.

20. The method of claim 16 further including securing the encapsulation structure over the mechanical structure using anodic bonding.

21. The method of claim 20 wherein the encapsulation structure includes an anodic shield.

22. The method of claim 21 wherein the encapsulation structure includes an insulation layer which is disposed on a cap wafer.

23. The method of claim 21 wherein the anodic shield is disposed on the insulation layer.

24. The method of claim 16 wherein the anti-stiction plug includes spin-on polymer, SOG or a metal material.

25. The method of claim 16 wherein the encapsulation structure includes one or more thin film encapsulation layers.

26. The method of claim 16 wherein the anti-stiction plug includes spin-on polymer or SOG which is deposited using dispensed silk screening, seal-glass, plastic and/or epoxy.

27. The method of claim 16 wherein the anti-stiction plug is deposited using shadow mask technology.

28. The method of claim 16 wherein the electromechanical device further includes a contact area and wherein the method further includes:
   forming a trench in the substrate, around the contact area; and
   depositing a first insulating material in the trench to electrically isolate the contact area.

29. The method of claim 28 further including:
   depositing a second insulating layer over at least a portion of the trench; and
   depositing a highly conductive material on the contact area and over the second insulating layer to provide electrical connection to the contact area.

30. The method of claim 28 further including:
   depositing a second insulating layer over at least a portion of the trench; and
   forming an anti-stiction window in the second insulating layer before forming the at least one anti-stiction channel through the substrate.

31. The method of claim 30 further including depositing a highly conductive material on the contact area and over the second insulating layer to provide electrical connection to the contact area wherein the anti-stiction plug includes the highly conductive material.

32. The method of claim 30 further including depositing a diffusion barrier on the anti-stiction plug.

33. The method of claim 30 wherein the diffusion barrier includes a polysilicon, germanium, silicon/germanium, silicon dioxide, silicon nitride, BPSG, PSG, SOG or metal bearing material.

34. The method of claim 30 wherein the anti-stiction fluid includes DDMS, OTS, PFOTCS, PFDA, FDTS, PFPE or FOTS.

35. The method of claim 30 further including depositing a highly conductive material on the contact area and over the second insulating layer and anti-stiction plug wherein the highly conductive material provides a barrier to diffusion for the chamber and electrical interconnection to the contact area.

* * * * *